US012610819B2

(12) United States Patent
Fountain, Jr. et al.

(10) Patent No.: US 12,610,819 B2
(45) Date of Patent: Apr. 21, 2026

(54) INTEGRATED COOLING ASSEMBLIES FOR ADVANCED DEVICE PACKAGING AND METHODS OF MANUFACTURING THE SAME

(71) Applicant: Adeia Semiconductor Bonding Technologies Inc., San Jose, CA (US)

(72) Inventors: Gaius Gillman Fountain, Jr., Youngsville, NC (US); Belgacem Haba, Saratoga, CA (US); George Carlton Hudson, Wendell, NC (US); Pawel Mrozek, San Jose, CA (US); Suhail Jaan Sadiq, Dublin, CA (US); Laura Mirkarimi, Sunol, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 178 days.

(21) Appl. No.: 18/393,028

(22) Filed: Dec. 21, 2023

(65) Prior Publication Data

US 2025/0210457 A1     Jun. 26, 2025

(51) Int. Cl.
*H10W 40/00*        (2026.01)
*H10P 72/70*        (2026.01)
(Continued)

(52) U.S. Cl.
CPC ............. *H10W 40/47* (2026.01); *H10P 72/74* (2026.01); *H10W 90/00* (2026.01);
(Continued)

(58) Field of Classification Search
CPC ... H01L 23/473; H01L 21/6835; H01L 24/32; H01L 24/40; H01L 24/73; H01L 25/0652;
(Continued)

(56) References Cited

U.S. PATENT DOCUMENTS

| | | | |
|---|---|---|---|
| 1,032,695 A | 7/1912 | Minier et al. | |
| 1,083,934 A | 1/1914 | Koebner et al. | |

(Continued)

FOREIGN PATENT DOCUMENTS

| | | |
|---|---|---|
| CN | 108735693 A | 11/2018 |
| CN | 109524373 A | 3/2019 |

(Continued)

OTHER PUBLICATIONS

"Microconvective Liquid Cooling for high power electronics," https://jetcool.com/technology/, downloaded Mar. 7, 2024, 6 pages.
(Continued)

*Primary Examiner* — Zhengfu J Feng
(74) *Attorney, Agent, or Firm* — HG LAW LLP

(57) ABSTRACT

A method of manufacturing a device package. The method comprises patterning a first substrate to form patterned regions comprising a thermal oxide layer. The method further comprises directly bonding the patterned regions of the first substrate to a second substrate to form a bonding interface. The bonded first and second substrates form an integrated cooling assembly comprising a coolant chamber volume. Portions of the first substrate exposed to the coolant chamber volume comprise a native oxide layer.

18 Claims, 14 Drawing Sheets

(51) Int. Cl.
*H10W 40/47* (2026.01)
*H10W 90/00* (2026.01)
*H10W 72/00* (2026.01)
*H10W 74/00* (2026.01)

(52) U.S. Cl.
CPC .......... *H10W 72/886* (2026.01); *H10W 74/00* (2026.01); *H10W 90/732* (2026.01); *H10W 90/735* (2026.01); *H10W 90/762* (2026.01); *H10W 90/764* (2026.01)

(58) Field of Classification Search
CPC . H01L 2224/32145; H01L 2224/32155; H01L 2224/40145; H01L 2224/40225; H01L 2224/73263; H01L 2924/01013; H01L 2924/01029; H01L 2924/182; H01L 2924/3511
USPC ........................................................ 361/699
See application file for complete search history.

(56) References Cited

U.S. PATENT DOCUMENTS

| | | | |
|---|---|---|---|
| 4,274,479 A | 6/1981 | Eastman | |
| 4,323,914 A | 4/1982 | Berndlmaier et al. | |
| 5,309,986 A | 5/1994 | Itoh | |
| 5,436,501 A | 7/1995 | Ikeda | |
| 5,522,452 A | 6/1996 | Mizuno et al. | |
| 5,769,154 A | 6/1998 | Adkins et al. | |
| 6,056,044 A | 5/2000 | Benson et al. | |
| 6,294,408 B1 | 9/2001 | Edwards et al. | |
| 6,351,384 B1* | 2/2002 | Daikoku | F28F 13/12 |
| | | | 361/689 |
| 6,686,532 B1 | 2/2004 | Macris | |
| 6,729,339 B1 | 5/2004 | Boyd et al. | |
| 6,822,326 B2 | 11/2004 | Enquist et al. | |
| 6,867,973 B2 | 3/2005 | Chang | |
| 7,190,581 B1 | 3/2007 | Hassani et al. | |
| 7,289,326 B2 | 10/2007 | Heydari et al. | |
| 7,294,926 B2 | 11/2007 | Schubert et al. | |
| 7,485,957 B2 | 2/2009 | Brandenburg et al. | |
| 7,511,372 B2 | 3/2009 | Chiu | |
| 7,523,617 B2 | 4/2009 | Venkatasubramanian et al. | |
| 7,578,338 B2 | 8/2009 | Yeh et al. | |
| 7,622,324 B2 | 11/2009 | Enquist et al. | |
| 7,692,926 B2 | 4/2010 | Henderson et al. | |
| 7,957,137 B2 | 6/2011 | Prasher | |
| 7,978,473 B2 | 7/2011 | Campbell et al. | |
| 7,997,087 B2 | 8/2011 | Venkatasubramanian et al. | |
| 8,042,606 B2 | 10/2011 | Batty et al. | |
| 8,164,169 B2 | 4/2012 | Chrysler et al. | |
| 8,356,657 B2 | 1/2013 | Zhao et al. | |
| 8,630,091 B2 | 1/2014 | Ward et al. | |
| 9,096,927 B2 | 8/2015 | West et al. | |
| 9,131,631 B2 | 9/2015 | Joshi | |
| 9,224,673 B2 | 12/2015 | Chen et al. | |
| 9,263,366 B2 | 2/2016 | Lin et al. | |
| 9,299,641 B2 | 3/2016 | Sekar et al. | |
| 9,355,932 B2 | 5/2016 | Ankireddi et al. | |
| 9,391,143 B2 | 7/2016 | Tong et al. | |
| 9,553,071 B1 | 1/2017 | Haba | |
| 9,711,433 B2 | 7/2017 | Taniguchi et al. | |
| 9,741,638 B2 | 8/2017 | Hsieh et al. | |
| 9,741,663 B2 | 8/2017 | Ishikura et al. | |
| 9,741,696 B2 | 8/2017 | Katkar et al. | |
| 9,746,248 B2 | 8/2017 | Semenov et al. | |
| 9,768,149 B2 | 9/2017 | Vadhavkar et al. | |
| 9,818,723 B2 | 11/2017 | Haba | |
| 10,032,695 B2* | 7/2018 | Iyengar | H01L 23/44 |
| 10,083,934 B2 | 9/2018 | Haba | |
| 10,157,818 B2 | 12/2018 | Chen et al. | |
| 10,170,392 B2 | 1/2019 | Chainer et al. | |
| 10,199,356 B2 | 2/2019 | Kinsley | |
| 10,312,221 B1 | 6/2019 | Agarwal et al. | |
| 10,332,823 B2 | 6/2019 | Chen et al. | |
| 10,461,059 B2 | 10/2019 | Koopmans et al. | |
| 10,694,641 B2 | 6/2020 | Basu et al. | |
| 10,744,603 B2* | 8/2020 | Machler | F28F 3/048 |
| 10,978,427 B2 | 4/2021 | Li et al. | |
| 11,187,469 B2 | 11/2021 | Karesh | |
| 11,191,184 B2 | 11/2021 | Mizerak et al. | |
| 11,387,164 B2 | 7/2022 | Wu et al. | |
| 11,598,594 B2 | 3/2023 | Lewis et al. | |
| 11,758,691 B2 | 9/2023 | Lin | |
| 11,942,396 B2 | 3/2024 | Chien et al. | |
| 11,996,351 B2 | 5/2024 | Hsiao et al. | |
| 12,283,490 B1 | 4/2025 | Fountain, Jr. et al. | |
| 2002/0020518 A1 | 2/2002 | Li | |
| 2002/0096508 A1 | 7/2002 | Weaver et al. | |
| 2003/0157782 A1 | 8/2003 | Kellar et al. | |
| 2004/0130874 A1 | 7/2004 | Maveety et al. | |
| 2004/0184237 A1 | 9/2004 | Chang | |
| 2004/0251530 A1 | 12/2004 | Yamaji | |
| 2005/0126766 A1 | 6/2005 | Lee et al. | |
| 2005/0168947 A1 | 8/2005 | Mok et al. | |
| 2005/0213301 A1 | 9/2005 | Prasher | |
| 2005/0280162 A1 | 12/2005 | Mok et al. | |
| 2006/0002088 A1 | 1/2006 | Bezama et al. | |
| 2006/0042825 A1 | 3/2006 | Lu et al. | |
| 2006/0060331 A1 | 3/2006 | Glezer et al. | |
| 2006/0103011 A1 | 5/2006 | Andry et al. | |
| 2006/0130506 A1 | 6/2006 | Tain et al. | |
| 2007/0025082 A1 | 2/2007 | Lee et al. | |
| 2007/0107875 A1 | 5/2007 | Lee et al. | |
| 2007/0231969 A1 | 10/2007 | Chrysler et al. | |
| 2008/0096320 A1 | 4/2008 | Farrar | |
| 2009/0122491 A1 | 5/2009 | Martin et al. | |
| 2010/0116534 A1 | 5/2010 | Choi et al. | |
| 2010/0230805 A1 | 9/2010 | Refai-Ahmed | |
| 2010/0277868 A1 | 11/2010 | Beaupre et al. | |
| 2010/0290188 A1* | 11/2010 | Brunschwiler | H01L 25/0657 |
| | | | 361/699 |
| 2010/0300202 A1 | 12/2010 | Joyce | |
| 2011/0129986 A1 | 6/2011 | Libralesso et al. | |
| 2013/0044431 A1 | 2/2013 | Koeneman | |
| 2013/0050944 A1 | 2/2013 | Shepard | |
| 2013/0087904 A1 | 4/2013 | Clark et al. | |
| 2013/0248153 A1 | 9/2013 | Sauciuc | |
| 2013/0270690 A1 | 10/2013 | Hsieh et al. | |
| 2014/0126150 A1 | 5/2014 | Song et al. | |
| 2014/0254099 A1 | 9/2014 | Takeda | |
| 2015/0194363 A1 | 7/2015 | Jun et al. | |
| 2016/0276314 A1 | 9/2016 | Ching et al. | |
| 2017/0012016 A1 | 1/2017 | Joshi et al. | |
| 2017/0092565 A1 | 3/2017 | Chen et al. | |
| 2017/0103937 A1 | 4/2017 | Hsieh et al. | |
| 2018/0053730 A1 | 2/2018 | Shao et al. | |
| 2018/0087842 A1 | 3/2018 | Chainer et al. | |
| 2018/0090427 A1 | 3/2018 | Bernstein et al. | |
| 2018/0160565 A1 | 6/2018 | Parida | |
| 2018/0211900 A1 | 7/2018 | Gutala et al. | |
| 2018/0308783 A1 | 10/2018 | Refai-Ahmed et al. | |
| 2019/0008071 A1 | 1/2019 | Kim | |
| 2019/0355706 A1 | 11/2019 | Enquist et al. | |
| 2019/0385928 A1 | 12/2019 | Leobandung | |
| 2019/0385933 A1 | 12/2019 | Eid et al. | |
| 2020/0035583 A1 | 1/2020 | Beauchemin et al. | |
| 2020/0049421 A1 | 2/2020 | Wakaoka et al. | |
| 2020/0105639 A1 | 4/2020 | Valavala et al. | |
| 2020/0312742 A1 | 10/2020 | Lofgreen et al. | |
| 2020/0343160 A1 | 10/2020 | Mizerak et al. | |
| 2020/0350233 A1 | 11/2020 | Mizerak et al. | |
| 2020/0352053 A1 | 11/2020 | Mizerak et al. | |
| 2020/0395313 A1 | 12/2020 | Mallik et al. | |
| 2021/0066164 A1 | 3/2021 | Wu et al. | |
| 2021/0175143 A1 | 6/2021 | Yu et al. | |
| 2021/0183741 A1 | 6/2021 | Jha et al. | |
| 2021/0193548 A1 | 6/2021 | Wan et al. | |
| 2021/0193620 A1 | 6/2021 | Refai-Ahmed et al. | |
| 2021/0280497 A1 | 9/2021 | Brun et al. | |
| 2021/0288037 A1 | 9/2021 | Tao et al. | |
| 2021/0296209 A1 | 9/2021 | Simon | |
| 2021/0378106 A1 | 12/2021 | Iyengar et al. | |
| 2021/0378139 A1 | 12/2021 | Rice et al. | |

(56) References Cited

U.S. PATENT DOCUMENTS

| | | |
|---|---|---|
| 2021/0410329 A1 | 12/2021 | Yang et al. |
| 2022/0037231 A1 | 2/2022 | Hsiao et al. |
| 2022/0087059 A1 | 3/2022 | Sathyamurthy et al. |
| 2022/0117115 A1 | 4/2022 | Malouin et al. |
| 2022/0130734 A1 | 4/2022 | Chiu et al. |
| 2022/0189850 A1 | 6/2022 | Liff et al. |
| 2022/0210949 A1 | 6/2022 | Edmunds et al. |
| 2022/0230937 A1 | 7/2022 | Malouin et al. |
| 2022/0408592 A1 | 12/2022 | Malouin et al. |
| 2023/0048500 A1 | 2/2023 | Malouin et al. |
| 2023/0154828 A1 | 5/2023 | Haba et al. |
| 2023/0156959 A1 | 5/2023 | Malouin et al. |
| 2023/0207474 A1 | 6/2023 | Uzoh et al. |
| 2023/0245950 A1 | 8/2023 | Haba et al. |
| 2023/0284421 A1 | 9/2023 | Malouin et al. |
| 2023/0298969 A1 | 9/2023 | Park et al. |
| 2024/0038633 A1 | 2/2024 | Haba et al. |
| 2024/0203823 A1 | 6/2024 | Uzoh et al. |
| 2024/0222222 A1 | 7/2024 | Haba et al. |
| 2024/0222226 A1 | 7/2024 | Haba |
| 2024/0249995 A1 | 7/2024 | Haba |
| 2024/0249998 A1 | 7/2024 | Gao et al. |
| 2024/0266255 A1 | 8/2024 | Haba et al. |
| 2024/0332128 A1 | 10/2024 | Uzoh et al. |
| 2024/0332129 A1 | 10/2024 | Haba et al. |
| 2025/0336686 A1 | 10/2025 | Fountain, Jr. et al. |

FOREIGN PATENT DOCUMENTS

| | | |
|---|---|---|
| CN | 106911058 B | 2/2020 |
| CN | 111128976 A | 5/2020 |
| CN | 115719735 A | 2/2023 |
| DE | 10315225 A1 | 10/2004 |
| JP | 2000-340727 A | 12/2000 |
| KR | 10-1049508 B1 | 7/2011 |
| KR | 10-2023-0136509 A | 9/2023 |
| TW | 200834871 A | 8/2008 |
| WO | 2013/097146 A1 | 7/2013 |
| WO | 2024/145475 A1 | 7/2024 |

OTHER PUBLICATIONS

Benson D.A. et al., "Micro-Machined Heat Pipes in Silicon MCM Substrates", Sandia National Laboratories, Sandia Report: SAND97-0100-UC-704, printed Jan. 1997, 17 pages.

Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.

KoolMicro Inc. developed the World's First 2,000 W/cm2 Cooling Technology for High Heat Generation Chips, Press Release, 2 pages, downloaded from www.semiconductorpackagingnews.com/uploads/1/KoolMicro_High_Cooling_Power_Density.pdf on Nov. 22, 2023.

Lau, J.H., "Chapter 3: Multiple System and Heterogeneous Integration with TSV-Interposers" In: "Chiplet Design and Heterogeneous Integration Packaging", Mar. 28, 2023, Springer Nature Singapore, Singapore, pp. 137-269.

Lau, J.H., "Recent Advances and Trends in Advanced Packaging", IEEE Transactions on Components, Packaging and Manufacturing Technology, IEEE, USA, vol. 12, No. 2, Feb. 2022, pp. 228-252.

Lien, M. B., et al., "Ranging and light field imaging with transparent photodetectors", nature photonics, vol. 14, 2020, pp. 143-148.

Lien, Y-J, et al., "An Energy-efficient Si-integrated Micro-cooler for High Power and Power-density Computing Applications," 74th Electronic Components and Technology Conference, 2024, pp. 1025-1029.

U.S. Appl. No. 18/784,639, filed Jul. 25, 2024, First Name Inventor: Gaius Gillman Fountain, "Fabrication Methods and Structures for Liquid Cooling Channel Chip".

U.S. Appl. No. 18/788,853, filed Jul. 30, 2024, First Name Inventor: Ron Zhang, "Fluid Channel Geometry Optimizations to Improve Cooling Efficiency".

Single-Phase Direct-to-Chip Liquid Cooling, 6 pages, downloaded from https://jetcool.com/posl/single-phase- direct-to-chip-liquid-cooling-microconvective-vs-microchannel-liquid-cooled-cold-plates/ on Mar. 7, 2024.

Walsh, Stephen Michael, "Microjet Impingement Cooling of High Power-Density Electronics," Thesis, submitted May 11, 2018, 93 pages.

Evan G. Colgan, "A Practical Implementation of Silicon Microchannel Coolers", available online at <https://www.electronics-cooling.com/2007/11/a-practical-implementation-of-silicon-microchannel-coolers/>, Nov. 1, 2007, 10 pages.

Francisco Pires, "TSMC Exploring On-Chip, Semiconductor-Integrated Watercooling", tom's Hardware, retrieved from https://www.tomshardware.com/news/tsmc-exploring-on-chip-semiconductor-integrated-watercooling, Jul. 13, 2021, 23 pages.

IBM, "Functional electronic packaging-Thermal management roadmap", available online at <https://web.archive.org/web/20170220095511/https://www.zurich.ibm.com/st/electronicpackaging/cooling.html>, Feb. 20, 2017, 7 pages.

International Search Report and Written Opinion received for PCT Patent Application No. PCT/US23/28942, mailed on Nov. 16, 2023, 12 pages.

International Search Report and Written Opinion received for PCT Patent Application No. PCT/US23/84874, mailed on Apr. 22, 2024, 7 pages.

International Search Report and Written Opinion received for PCT Patent Application No. PCT/US23/85801, mailed on Apr. 26, 2024, 8 pages.

International Search Report and Written Opinion received for PCT Patent Application No. PCT/US23/85816, mailed on Apr. 23, 2024, 11 pages.

International Search Report and Written Opinion received for PCT Patent Application No. PCT/US23/86233, mailed on Apr. 26, 2024, 7 pages.

Kaplan, F., et al., "LoCool: Fighting Hot Spots Locally for Improving System Energy Efficiency", IEEE Transactions on Computer-Aided Design of Integrated Circuits and Systems, vol. 39, No. 4, Apr. 2020, pp. 895-908.

U.S. Appl. No. 18/129,567, filed Mar. 31, 2023, First Name Inventor: Cyprian Emeka Uzoh, "Embedded Cooling Systems for Device Packages and Methods of Cooling Packaged Devices".

PCT Application No. PCT/US2024/022253, International Search Report and Written Opinion dated Jul. 17, 2024, 14 pages.

Shamsa, M., et al., "Thermal conductivity of diamond-like carbon films", Applied Physics Letters, vol. 89, No. 16, Oct. 20, 2006, pp. 161921-161921-3.

Wu, C. J., et al., "Ultra High Power Cooling Solution for 3D-Ics", 2021 Symposium on VLSI Technology, Jun. 2021, 2 pages.

* cited by examiner

300

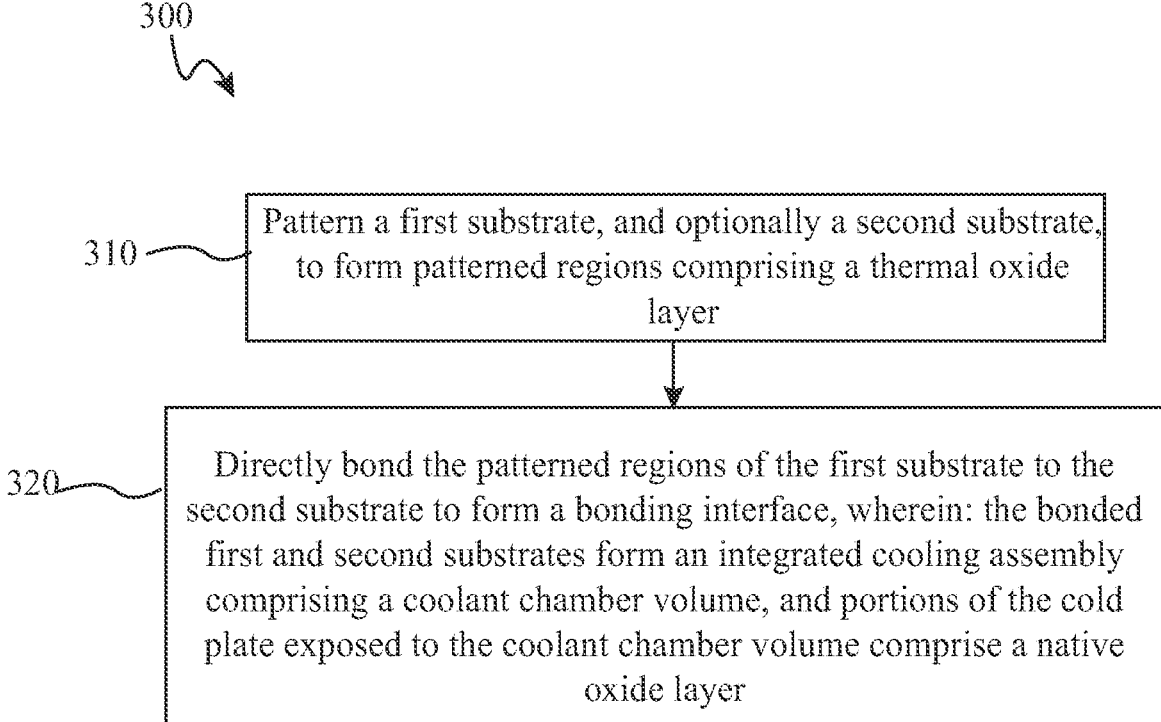

310 — Pattern a first substrate, and optionally a second substrate, to form patterned regions comprising a thermal oxide layer 320 — Directly bond the patterned regions of the first substrate to the second substrate to form a bonding interface, wherein: the bonded first and second substrates form an integrated cooling assembly comprising a coolant chamber volume, and portions of the cold plate exposed to the coolant chamber volume comprise a native oxide layer

710 Prepare first and second substrates for bonding using a plasma activation process, wherein surfaces of the first and/or second substrates comprise a native oxide layer only 720 Directly bond the first substrate to the second substrate to form a cold plate

INTEGRATED COOLING ASSEMBLIES FOR ADVANCED DEVICE PACKAGING AND METHODS OF MANUFACTURING THE SAME

FIELD

The present disclosure relates to advanced packaging for microelectronic devices, and in particular, embedded cooling systems for device packages and methods of manufacturing the same.

BACKGROUND

Energy consumption poses a critical challenge for the future of large-scale computing as the world's computing energy requirements are rising at a rate that most would consider unsustainable. Some models predict that the information, communications and technology (ICT) ecosystem could exceed 20% of global electricity use by 2030, with direct electrical consumption by large-scale computing centers accounting for more than one-third of that energy usage. Cooling costs make up a significant portion of computing center energy requirements as even small increases in operating temperatures can negatively impact the performance of microprocessors, memory devices, and other electronic components.

Thermal dissipation in high-power density chips (semiconductor devices) is also a critical challenge as improvements in chip performance, e.g., through increased gate density and multi-core microprocessors, have resulted in increased power density and a corresponding increase in thermal flux that contributes to elevated chip temperatures. These elevated temperatures are undesirable as they can degrade the chip's operating performance, efficiency, and reliability. Cooling systems used to maintain the chip at a desired operating temperature typically remove heat using one or more heat dissipation devices, e.g., thermal spreaders, heat pipes, cold pipes, and heat sinks. Such cooling systems can suffer from reduced cooling efficiency due to the design and manufacture of system components.

Accordingly, there exists a need in the art for improved energy-efficient cooling systems and methods of manufacturing the same.

SUMMARY

Embodiments herein provide integrated cooling assemblies embedded in advanced device packages. Advantageously, the integrated cooling assemblies provide coolant chamber volumes with increased surface area volume, which improve cooling efficiency. Furthermore, methods of manufacturing such integrated cooling assemblies provide cold plates with surfaces that facilitate more efficient thermal transfer of heat from a semiconductor device to coolant fluid.

One general aspect includes, a method of manufacturing a device package. The method comprises patterning a first substrate to form patterned regions comprising a thermal oxide layer. The method further comprises directly bonding the patterned regions of the first substrate to a second substrate to form a bonding interface. The bonded first and second substrates form an integrated cooling assembly comprising a coolant chamber volume. Portions of the first substrate exposed to the coolant chamber volume comprise a native oxide layer.

In some embodiment, the native oxide layer is about 2 nm-5 nm thick.

In some embodiments, wherein the thermal oxide layer is greater than 5 nm.

Another general aspect includes, a method of manufacturing a device package. The method comprises preparing first and second substrates for bonding using a plasma activation process, wherein surfaces of the first and/or second substrates comprise a native oxide layer only. The method further comprises directly bonding the first substrate to the second substrate to form an integrated cooling assembly.

Another general aspect includes, a device package comprising an integrated cooling assembly. The integrated cooling assembly comprises a semiconductor device and a cold plate attached to the semiconductor device. The cold plate comprises a top portion and a bottom portion. The bottom portion is bonded to a backside of the semiconductor device. The top portion comprises sidewalls extending downwardly to the bottom portion to define a coolant chamber volume therebetween. A width of the coolant chamber volume between opposite sidewalls of the top portion is greater than a width of the backside of the semiconductor device.

BRIEF DESCRIPTION OF THE DRAWINGS

The above and other objects and advantages of the disclosure will be apparent upon consideration of the following detailed description, taken in conjunction with the accompanying drawings, in which:

FIG. 3A shows a method that can be used to manufacture the integrated cooling assemblies described herein;

Figure 1A:
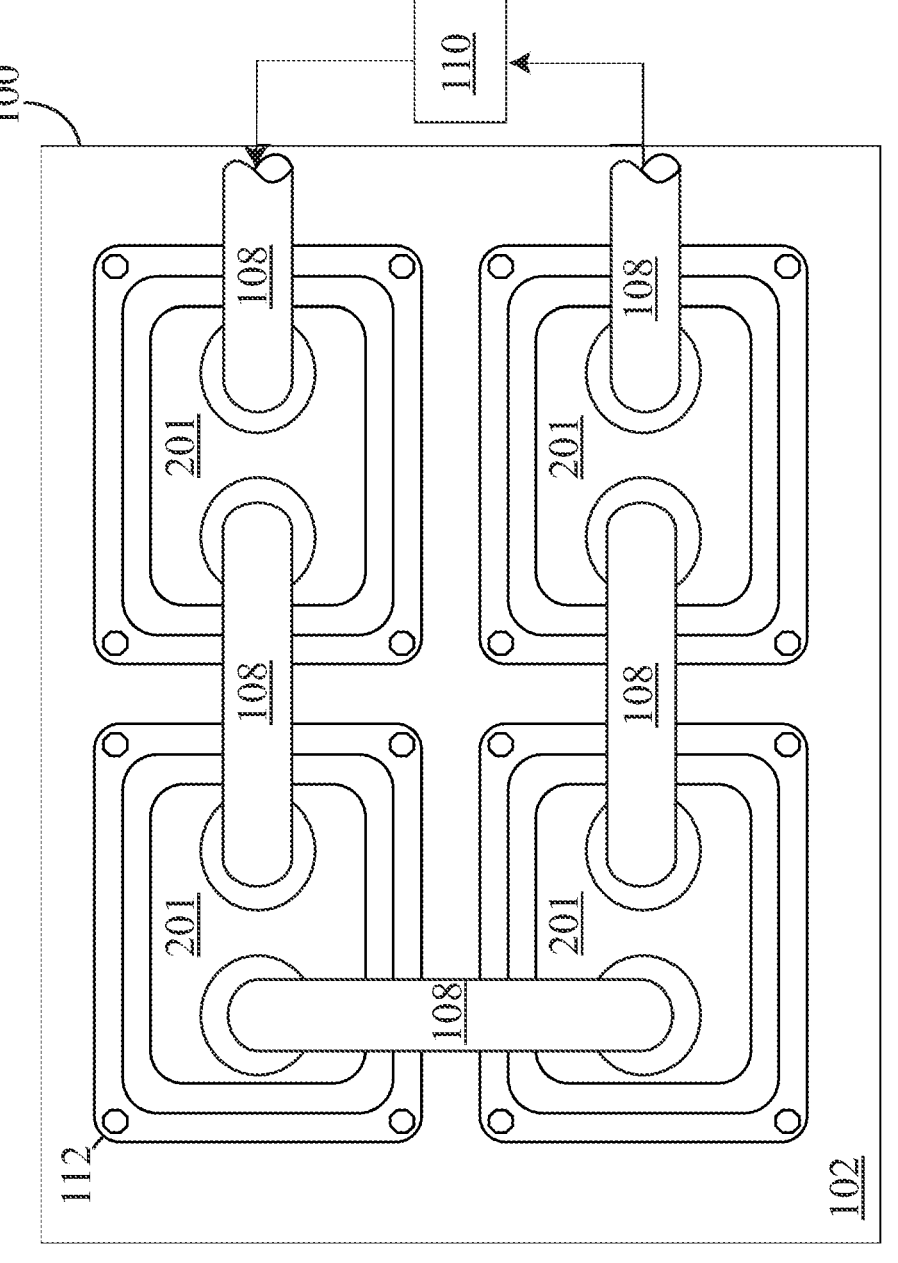
FIG. 1A is a schematic plan view of an example of a system panel, in accordance with embodiments of the disclosure.
Figure 1A:
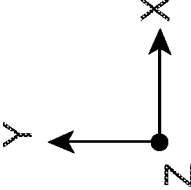

The figures herein depict various embodiments of the disclosure for purposes of illustration only. It will be appreciated that additional or alternative structures, assemblies, systems, and methods may be implemented within the principles set out by the present disclosure.

DETAILED DESCRIPTION

As used herein, the term "substrate" means and includes any workpiece, wafer, or article that provides a base material or supporting surface from which or upon which components, elements, devices, assemblies, modules, systems, or features of heat-generating devices, packaging components, and cooling assembly components described herein may be formed. The term substrate also includes "semiconductor substrates" that provide a supporting material upon which elements of a semiconductor device are fabricated or attached, and any material layers, features, and/or electronic devices formed thereon, therein, or therethrough.

As described below, the semiconductor substrates herein generally have a "device side," e.g., the side on which semiconductor device elements are fabricated, such as transistors, resistors, and capacitors, and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that form the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, e.g., after substrate thinning operations. Depending on the stage of device fabrication or assembly, the terms "active" and "non-active sides" are also used to describe surfaces of material layers or features formed on, in, or through the semiconductor substrate, whether or not the material layers or features are ultimately present in the fabricated or assembled device.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower,", "top", "bottom"" and the like are generally made with reference to the X, Y, and Z directions set forth by X, Y and Z axis in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," either alone or in combination with a spatially relevant term include both relationships with intervening elements and direct relationships where there are no intervening elements. Furthermore, the terms "horizontal" and "vertical" are generally made with reference to the X and Z directions set forth in the drawings, respectively.

Various embodiments disclosed herein include bonded structures in which two or more elements are directly bonded to one another without an intervening adhesive (referred to herein as "direct bonding", or "directly bonded"). In some embodiments, direct bonding includes the bonding of a single material on the first of the two or more element and a single material on a second one of the two more elements, where the single materials on the different elements may or may not be the same. Direct bonding can also include bonding of multiple materials on one element to multiple materials on the other element (e.g., hybrid bonding). As used herein, the term "hybrid bonding" refers to a species of direct bonding in which both i) nonconductive features directly bond to nonconductive features, and ii) conductive features directly bond to conductive features.

Unless otherwise noted, the terms "cooling assembly" and "integrated cooling assembly" generally refers to a semiconductor device and a cold plate attached to the semiconductor device. Typically, the cold plate is formed with recessed surfaces that define a fluid cavity (e.g., a coolant chamber volume). The fluid cavity may alternatively be referred to as a cooling chamber volume. The cold plate may comprise a polymer material. The cold plate may alternatively be referred to as a manifold. The cold plate may be attached to the semiconductor device by use of a compliant adhesive layer or by direct dielectric or hybrid bonding. For example, the cold plate may include material layers and or metal features which facilitate direct dielectric or hybrid bonding with the semiconductor device. Beneficially, the backside of the semiconductor device is directly exposed to coolant fluids flowing through the integrated cooling assembly, thus providing for direct heat transfer therebetween. Unless otherwise noted, the integrated cooling assemblies described herein may be used with any desired fluid, e.g., liquid, gas, and/or vapor-phase coolants. Example liquids include: water, deionized water, glycol, a mixture of water and glycol (e.g. ethylene glycol and water (EGW) and propylene glycol and water (PGW), dielectric fluids (e.g. fluorocarbons, polyalphaolefin (PAO), etc.). Example gases include atmospheric air and/or one or more inert gases such as nitrogen. Atmospheric air may be taken to mean the mixture of different gases in Earth's atmosphere made up of about 78% nitrogen and 21% oxygen. In some embodiments, the coolant fluids may contain additives to enhance the conductivity of the cooling fluid within the integrated cooling assemblies. The additives may comprise for example, nano-particles of carbon nanotube, nano-particles of graphene, nano-particles of metal oxides. The concentration of these nano-particles may be less than 1%, less than 0.2% and still less than 0.05%. The cooling fluids may also contain small amount of glycol or glycols (e.g. propylene glycol, ethylene glycol etc.) to reduce frictional shear stress and drag coefficient in the cooling fluid within the integrated cooling assembly.

As described below, coolant fluid flowing through a cold plate may be used to control the temperature of semiconductor devices. The fluid flowing across the surface of the semiconductor device absorbs heat and conducts heat away from the device.

FIG. 1A is a schematic plan view of an example of a system panel 100, in accordance with embodiments of the disclosure. Generally, the system panel 100 includes a printed circuit board, here PCB 102, a plurality of device packages 201 mounted to the PCB 102, and a plurality of coolant delivery lines 108 fluidly coupling each of the device packages 201 to a coolant source 110. It is contemplated that coolant may be delivered to each of the device packages 201 in any desired fluid phase, e.g., liquid, vapor, gas, or combinations thereof and may flow out from the device package 201 in the same phase or a different phase. In some embodiments the coolant is delivered to the device package 201 and returned therefrom as a liquid and the coolant source 110 may comprise a heat exchanger or chiller to maintain the coolant at a desired temperature. In other embodiments, the coolant may be delivered to the device packages 201 and returned therefrom as a gas, and the coolant source 110 may comprise a heat exchanger or chiller to maintain the coolant at a desired temperature. In other embodiments, the coolant may be delivered to the device packages 201 as a liquid, vaporized within the device package, and returned to the coolant source 110 as a vapor. In those embodiments, the device packages 201 may be fluidly coupled to the coolant source 110 in parallel and the coolant source 110 may include or further include a compressor (not shown) for condensing the received vapor to a liquid form.

Figure 1B:
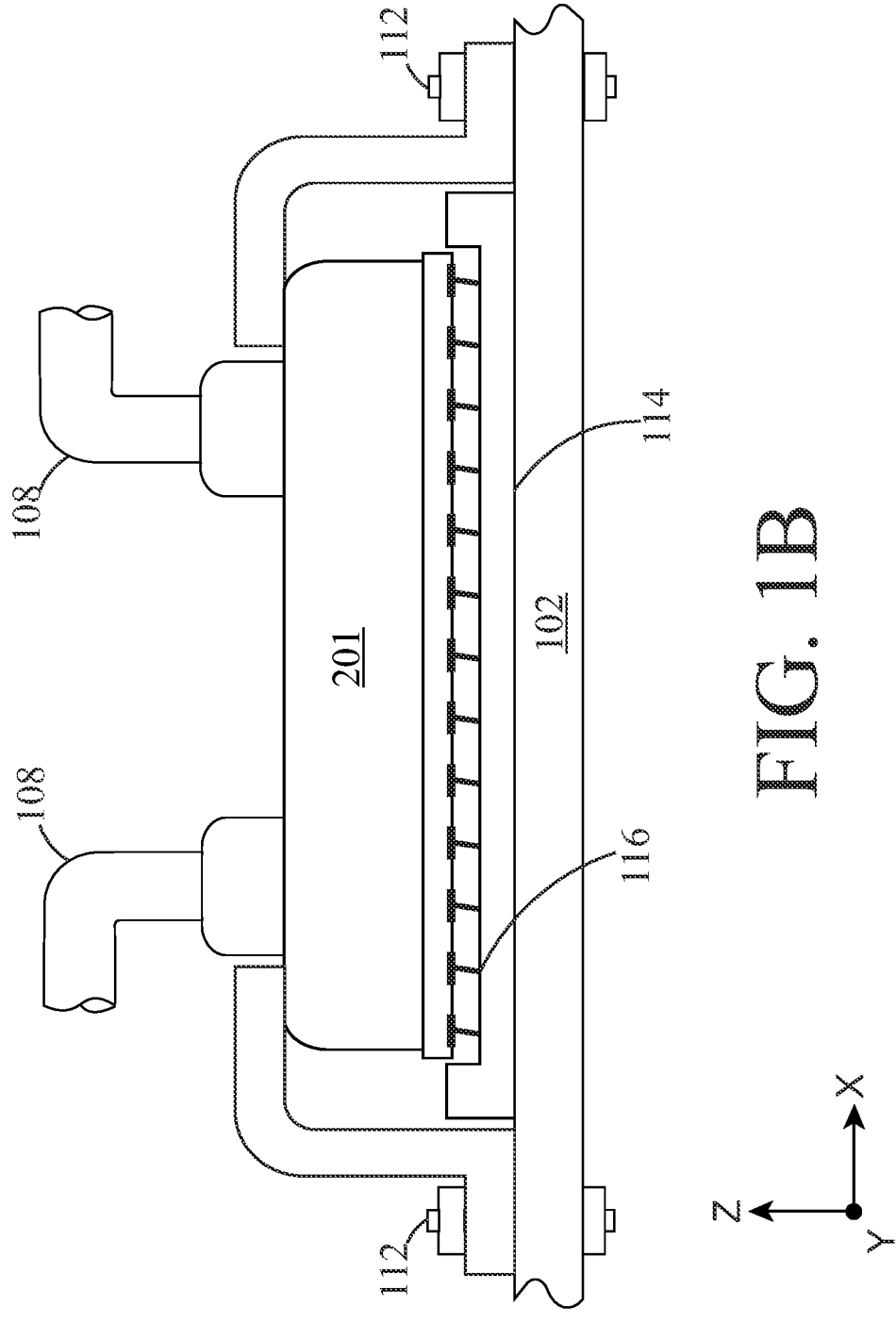
FIG. 1B is a schematic partial sectional side view of a device package mounted on a PCB, in accordance with embodiments of the disclosure.

FIG. 1B is a schematic partial sectional side view of a portion of the system panel 100 of FIG. 1A. As shown, each device package 201 is disposed in a socket 114 of the PCB 102 and connected thereto using a plurality of pins 116, or by other suitable connection methods, such as solder bumps (not shown). The device package 201 may be seated in the socket 114 and secured to the PCB 102 using a mounting frame and a plurality of fasteners 112, e.g., compression screws, collectively configured to exert a relatively uniform downward force on the upward facing edges of the device package 201. The uniform downward force ensures proper pin contact between the device package 201 and the socket 114.

Figure 2A:
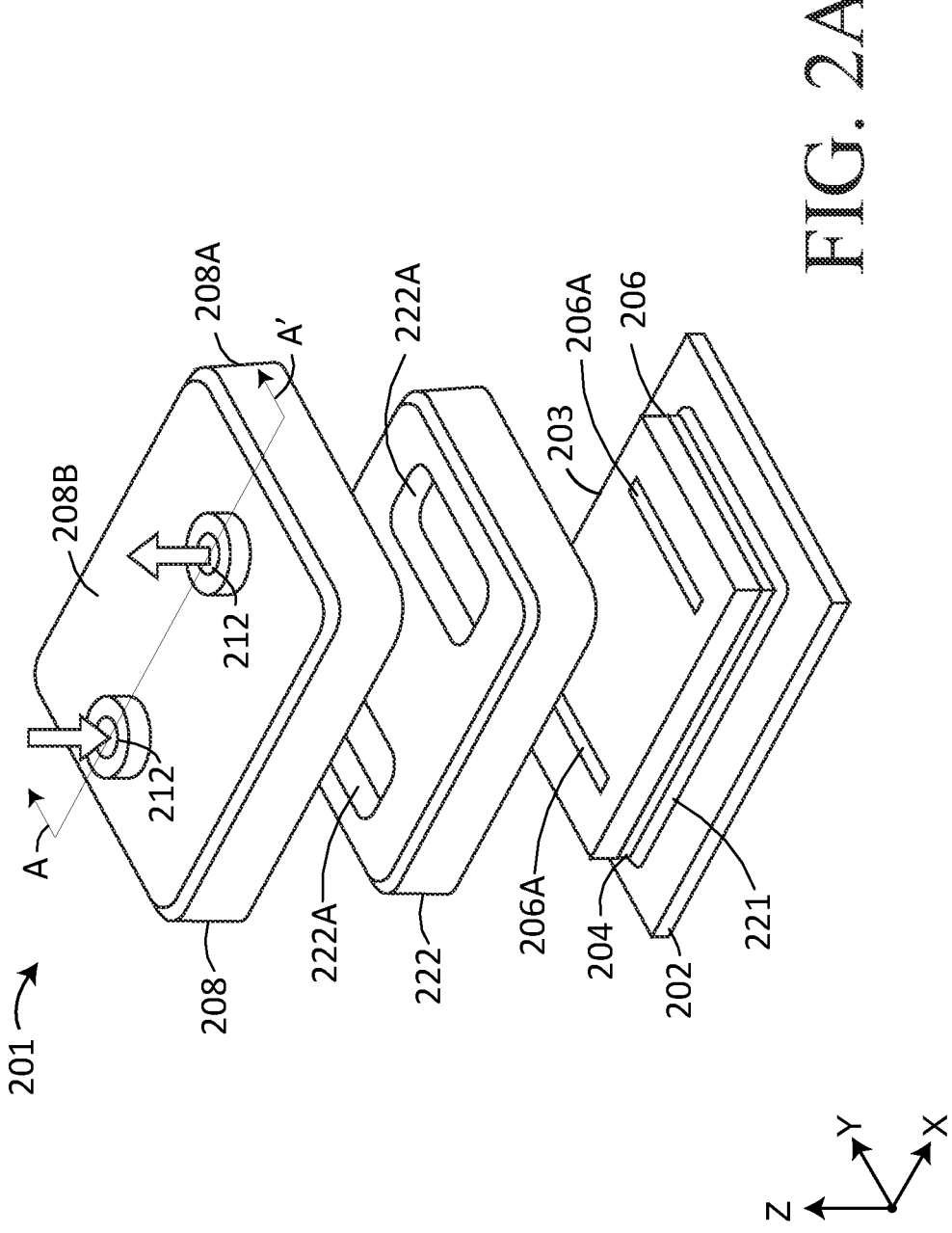
FIG. 2A is a schematic exploded isometric view of the device package in FIG. 1B.
Figure 2B:
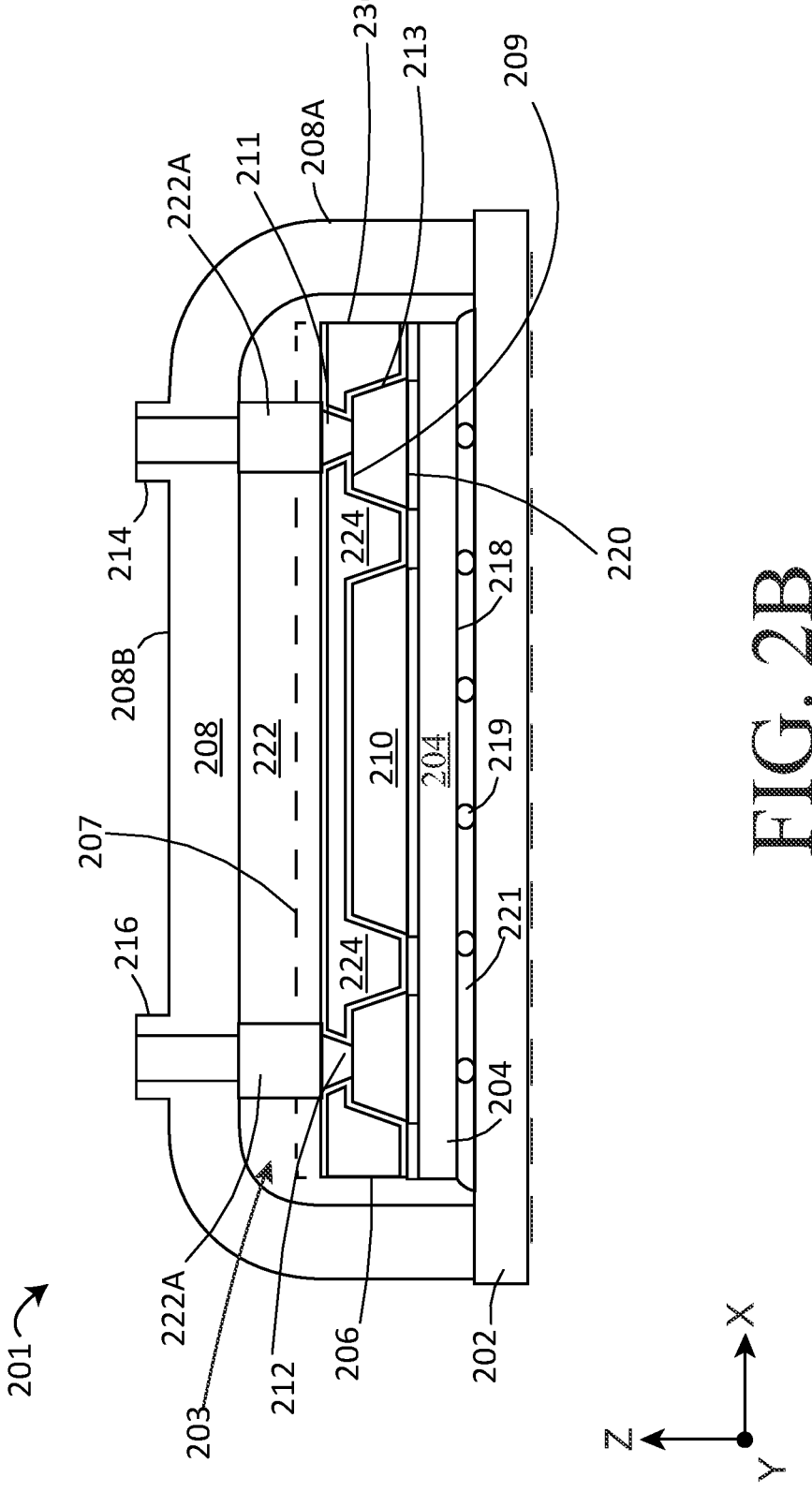
FIG. 2B is a schematic sectional view of an example device package, in accordance with embodiments of the present disclosure, that may be used with the system panel.

FIG. 2A is a schematic exploded isometric view of an example device package 201, in accordance with embodiments of the disclosure. FIG. 2B is a schematic sectional view of the device package 201 taken along line A-A' of FIG. 2A. Generally, the device package 201 includes a package substrate 202, an integrated cooling assembly 203 disposed on the package substrate 202, and a package cover 208 (208A and 208B in FIG. 2A) disposed on a peripheral portion of the package substrate 202. The package cover 208 extends over the integrated cooling assembly 203 so that the integrated cooling assembly 203 is disposed between the package substrate 202 and the package cover 208. As shown, the device package 201 further includes a sealing material layer 222 that forms a coolant impermeable barrier between the package cover 208 to the integrated cooling assembly 203. Coolant is delivered to the integrated cooling assembly 203 via inlet/outlet openings 216, 214 in the package cover 208 and corresponding openings 222A formed through the sealing material layer 222. In some embodiments, the device package 201 may further include a support member 207 attached to the integrated cooling assembly 203.

Generally, the package substrate 202 includes a rigid material, such as an epoxy or resin-based laminate, that supports the integrated cooling assembly 203 and the package cover 208. The package substrate 202 may include conductive features disposed in or on the rigid material that electrically couple the integrated cooling assembly 203 to a system panel, such as the PCB 102.

The integrated cooling assembly 203 typically includes a semiconductor device, here device 204, and a cold plate 206 bonded to the device 204. Here, the device 204 includes an active side 218 that includes device components, e.g., transistors, resistors, and capacitors, formed thereon or therein, and a non-active side, here the device backside 220, opposite the active side 218. As shown, the active side 218 is positioned adjacent to and facing towards the package substrate 202. The active side 218 may be electrically connected to the package substrate 202 by use of conductive bumps 219, which are encapsulated by an underfill layer 221 disposed between the device 204 and the package substrate 202. The underfill layer 221 may comprise a cured polymer resin or epoxy, which provides mechanical support to the conductive bumps 219 and protects against thermal fatigue. The cold plate 206 may be disposed on the package substrate 202 with the semiconductor device 204 attached to the package substrate 202. For example, the semiconductor device 204 may be disposed between the cold plate 206 and the package substrate 202.

The cold plate 206 generally includes a top portion 230 and sidewalls 213 extending downwardly from the top portion 230 to define a coolant chamber volume 210 therebetween. The top portion 230 comprises a patterned side that faces towards the device 204 and an opposite side that faces towards the package cover 208. The patterned side includes a device facing cavity comprising a base surface 209, the sidewalls 213 that surround the base surface 209, and a plurality of support features 224 disposed inwardly of the sidewalls 213. When attached to the device 204 disposed therebelow the sidewalls 213 form a perimeter of the coolant chamber volume 210, the base surface 209 forms an uppermost surface of the coolant chamber volume 210, and the device backside 220 forms the bottom of the coolant chamber volume volume 210. Thus, the device backside 220 is in direct thermal contact with coolant fluid flowed therethrough.

Generally, the support features 224 extend from the base surface 209 to a bonding interface with the device backside 220. The bonding interface may alternatively be referred to as a bonded interface. The support features 224 provide structural support to the integrated cooling assembly 203 and disrupt laminar fluid flow at the interface of the coolant and the device backside 220 resulting in increased heat transfer therebetween. It will be understood that, in certain embodiments, the cold plate 206 may not include any support features 224 and the base surface 209 may be substantially flat (i.e., parallel to the device backside 220).

Here, coolant is circulated through the coolant chamber volume 210 through openings disposed through the cold plate 206, shown here as inlet opening 212 and outlet opening 211, disposed between the downwardly facing base surface 209 and an opposite upwardly facing surface. The inlet and outlet opening may be in fluid communication with the inlet and outlet openings 216, 214 of the package cover 208 through openings 222A formed in the sealing material layer 222 disposed therebetween.

An example flow path of fluid through the coolant chamber volume 210 may be as follows:

1. fluid enters the coolant chamber volume 210 through the inlet opening 212;
2. the fluid flows across the inside surfaces of the cold plate 206 and absorbs heat generated by the semiconductor device 204 which has dissipated into the cold plate 206 structure; and 3. the fluid exits the coolant chamber volume 210 through outlet opening 211.

As described in the methods below, the cold plate 206 may be patterned using an anisotropic etch process that causes surfaces of the sidewalls 213 and the support features 224 to slope, i.e., to form an angle of less than 90° with the bonding surface of the device 204. The anisotropic etch process causes the support features 224 to have a trapezoidal shape in cross section where each of the support features 224 is wider at the base surface 209 than at its interface with the device 204. Similarly, the sidewalls 213 may slope away from the base surface 209 and may be wider at their base than at the interface with the device 204.

The sloped surface desirably increase the stability of the sidewalls 213 and support features 224 during manufacturing of the integrated cooling assembly 203. The added stability allows for the width of the field surfaces of the sidewalls 213 to be narrower, and the coolant channels to be deeper, when compared to cold plates having orthogonal surfaces, as narrow features at the base may undesirably buckle and break as the aspect ratio (height to width ratio) thereof is increased.

Here, the cold plate 206 is attached to the device backside 220 without the use of an intervening adhesive material, e.g., the cold plate 206 may be directly bonded to the device backside 220, such that the cold plate 206 and the device backside 220 are in direct thermal contact. The package cover 208 generally comprises one or more vertical or sloped sidewall portions 208A and a lateral portion 208B that spans and connects the sidewall portions 208A. The sidewall portions 208A extend upwardly from a peripheral surface of the package substrate 202 to surround the device 204 and the cold plate 206 disposed thereon. The lateral portion 208B is disposed over the cold plate 206 and is typically spaced apart from the cold plate 206 by a gap corresponding to the thickness of the sealing material layer 222. Coolant is circulated through the coolant chamber volume 210 through the inlet and outlet openings 211, 214 formed through the lateral portion 208B. In each of the embodiments described herein, coolant lines 108 may be attached to the device package 201 by use of connector features formed in the package cover 208, such as threads formed in the sidewalls of the inlet and outlet openings 216, 214 and/or protruding features that surround the openings 216, 214 and extend upwardly from a surface of the lateral portion 208B.

Typically, the package cover 208 is formed of semi-rigid or rigid material so that at least a portion of the downward force exerted on the package cover 208 by the mounting frame is transferred to a supporting surface of the package substrate 202 and not transferred to the cold plate 206 and the semiconductor device 204 therebelow. In some embodiments, the package cover 208 is formed of a thermally conductive metal, such as aluminum or copper. In some embodiments, the package cover 208 functions as a heat spreader that redistributes heat from one or more electronic components within a multi-component device package, such as described below.

The sealing material layer 222 forms an impermeable barrier between the integrated cooling assembly 203 and the package cover 208 that prevents coolant from reaching the active side 218 of the device 204 and causing damage thereto. In some embodiments, the sealing material layer 222 comprises a polymer or epoxy material that extends upwardly from the package substrate 202 to encapsulate and/or surround at least a portion of the semiconductor device 204. In other embodiments, the sealing material layer

222 may be disposed between only the upward facing surface of the cold plate 206 and the portion of the package cover 208 disposed thereover. In some embodiments, the sealing material layer 222 is formed from a molding compound, e.g., a thermoset resin, that when polymerized, forms a hermetic seal between the package cover 208 and the cold plate 206. Here, coolant is delivered to the cold plate 206 through openings 222A disposed through the sealing material layer 222. As shown, the openings 222A are respectively in registration and fluid communication with the inlet and outlet openings 216, 214 of the package cover 208 thereabove and the inlet and outlet openings 212, 211 in the cold plate 206 therebelow.

Beneficially, the sealing material layer 222 provides mechanical support that improves system reliability and extends the useful lifetime of the device package 201. For example, the sealing material layer 222 may reduce mechanical stresses that can weaken interfacial bonds and/or electrical connections between electrical components of the device package 201, such as stresses caused by vibrations, mechanical and thermal shocks, and/or fatigue caused by repeated thermal cycles. In some embodiments, the sealing material layer 222 may be a thermally conductive material, such as a polymer or epoxy having one or more thermally conductive additives, such as silver and/or graphite. In some embodiments, the device package 201 further includes a support member 207 attached to the upward-facing side of the cold plate 206, the support member 207 may be formed of a rigid material, e.g., a metal or ceramic plate, that provides mechanical support to the cold plate 206. The support member 207 may be attached to the cold plate 206 using a direct bonding method or by use of an intervening adhesive layer (not shown).

Here, the inlet opening 212 and the outlet opening 211 are both formed in opposite side of the cold plate 206. However, it will be understood that the inlet opening 212 and/or the outlet opening 211 may be formed on different surfaces of the cold plate 206. For example, the inlet opening 212 may be formed in the opposite side of the cold plate 206 and the outlet opening 211 may be formed in an orthogonal side surface of the cold plate 206 (e.g., as part of a sidewalls 213). In such embodiments, the opposite side of the cold plate 206 may comprise plural inlet openings 212. In other embodiments, the outlet opening 211 may instead be formed on the opposite side of the cold plate 206, for example in place of one of the inlet opening 212. It will be understood that the inlet openings 212 and the outlet opening 211 are shown in a section view. The openings 212, 211 may have any cross-sectional shape that allows fluid to flow therethrough. For example, the openings 212, 211 may have rectangular, square, hexagonal or circular cross-sections. The backside 220 of the semiconductor device 204 may be bonded to the patterned side of the cold plate 206 at the bonded interface. The bonded interface may extend along a perimeter of the backside 220. Here, the cold plate 206 is rectangular and the bonded interface extends along all four edges of the perimeter of the backside 220.

The bonded interface may be formed using at least one thermal oxide layer disposed on the cold plate 206 and/or the backside 220, as discussed in more detail below in relation to method 300 and FIG. 3A.

As discussed in more detail below with reference to method 300, portions of the cold plate 206 and/or portions of the backside 220 exposed to the coolant chamber volume 210 may comprise a native oxide layer.

In some embodiments, the cold plate 206 is attached to the semiconductor device 204 using a direct dielectric bonding process. In other embodiments, the cold plate 206 is attached to the semiconductor device 204 using a hybrid of direct dielectric bonds and direct metal bonds formed therebetween. For example, in some embodiments, one or both of the cold plate 206 and the backside 220 of the semiconductor device 204 comprise a dielectric material layer, e.g., a first dielectric material layer and a second dielectric material layer respectively, and the cold plate 206 is directly bonded to the backside 220 of the semiconductor device 204 through bonds formed between the dielectric material layers.

In some embodiments, the cold plate 206 is attached to the semiconductor device 204 using a hybrid bonding technique, where bonds are formed between the dielectric material layers and between metal features, such as between first metal pads and second metal pads, disposed in the dielectric material layers.

Suitable dielectrics that may be used as the dielectric material layers include silicon oxides, silicon nitrides, silicon oxynitrides, silicon carbon nitrides, metal-oxides, metal-nitrides, silicon carbide, silicon oxycarbides, silicon oxycarbonitride, silicon carbonitride, diamond-like carbon (DLC), or combinations thereof. In some embodiments, one or both of the dielectric material layers are formed of an inorganic dielectric material, e.g., a dielectric material substantially free of organic polymers. Typically, one or both of the dielectric layers are deposited to a thickness greater than the thickness of a native oxide, such as about 1 nanometer (nm) or more, 5 nm or more, 10 nm or more, 50 nm or more, 100 nm or more, or 100 nm or more. In some embodiments, the one or both of the layers are deposited to a thickness of 300 nm or less, such as 100 nm or less, 100 nm or less, or 50 nm or less.

The cold plate 206 may be formed of any suitable material that has sufficient structural strength to withstand the desired pressures of coolant flowing into the coolant chamber volume 210. For example, the cold plate 206 may be formed of a material selected from a group comprising polymers, metals, ceramics, or composites thereof. In some embodiments, the cold plate 206 may be formed of stainless steel (e.g., from a stainless steel metal sheet) or a sapphire plate. In some embodiments, the cold plate 206 may be formed of a material having a substantially different coefficient of thermal expansion (CTE) from the semiconductor device 204, e.g., a CTE mismatched material. In such embodiments, the cold plate 206 may be attached to the semiconductor device 204 by a compliant adhesive layer (not shown) or a molding material that absorbs the difference in expansion between the cold plate 206 and the semiconductor device 204 across repeated thermal cycles.

Figure 3B:
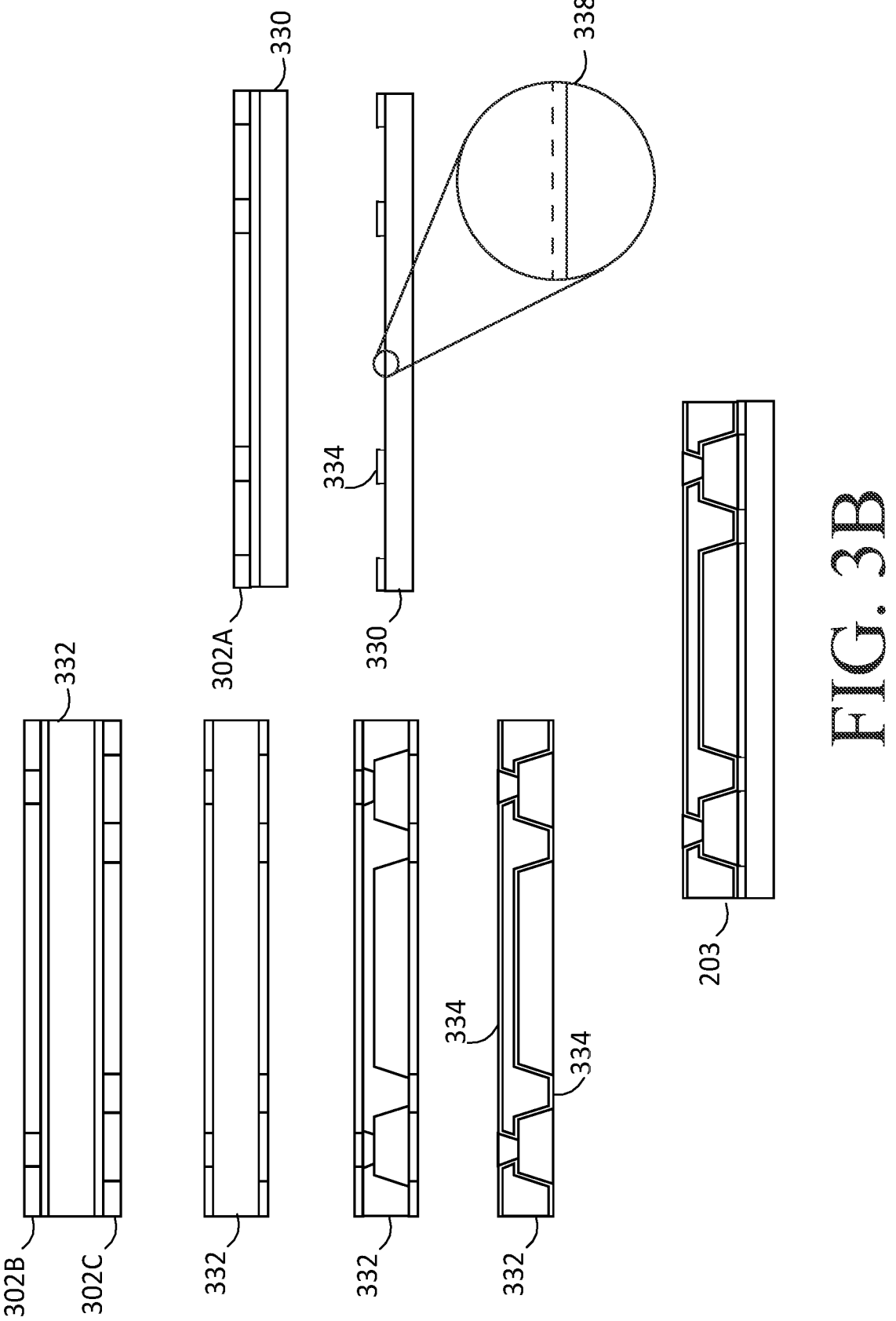
FIG. 3B shows an integrated cooling assembly at different stages of manufacturing to illustrate aspects of the method in FIG. 3A.

FIG. 3A is a flow diagram setting forth a method 300 of forming an integrated cooling assembly, according to embodiments of the disclosure. FIG. 3B schematically illustrates the integrated cooling assembly 203 at various stages of the method 300. Generally, the method 300 includes bonding a first substrate 330 to a second substrate 332 and singulating the integrated cooling assembly 203 from the bonded substrates. In FIG. 3B, the first substrate 330 comprising the semiconductor device 204 and the second substrate 332 comprises the cold plate 206. However, as discussed in more detail below in relation to FIG. 5 and FIG. 6, a first substrate may refer to a substrate comprising a cold plate and a second substrate may refer to a substrate comprise a semiconductor device (i.e., the terminology of first and second substrates may be inverted).

With reference to FIG. 3B, the method 300 may include patterning the second substrate 332 (e.g., a monocrystalline silicon wafer) to form patterned regions. For example, the second substrate 332 may be a double side polished wafer where both sides comprise a thermal oxide layer (e.g., thermal oxide layers about 1 to 2 microns thick). Top and bottom surfaces of the second substrate 332 may be patterned using first and second photoresist layers 302B, 302C, respectively, to create an oxide pattern in the thermal oxide layers forming thermal oxide mask layers (e.g., thermal oxide hard masks).

The thermal oxide mask layers are selective to anisotropic etch compared to the underlying monocrystalline silicon substrate. In some embodiments, the mask layers have a thickness of about 100 nm or less, such as about 50 nm or less, or about 30 nm or less. The patterning may use any suitable combination of lithography and material etching patterning methods.

The second substrate 332 may then be cleaned before proceeding with a wet etch process to form the sidewalls 213, and in some embodiments the support features 224, of the cold plate 206 as discussed above in relation to FIG. 2B. This further wet etch process may use any suitable wet etchants, such as TMAH or KOH.

The anisotropic etch process uses inherently differing etch rates for the silicon material which is exposed to an anisotropic etchant. In some embodiments, the etching process is controlled to where the etch rates of the exposed silicon material have a ratio between about 1:10 and about 1:200, such as between about 1:10 and about 1:100, for example between about 1:10 and 1:50, or between about 1:25 and 1:75. Examples of suitable anisotropic wet etchants include aqueous solutions of potassium hydroxide (KOH), ethylene diamine and pyrocatechol (EPD), ammonium hydroxide (HN4OH), hydrazine (N2H4), or tetra methyl ammonium hydroxide (TMAH).

Examples of suitable anisotropic dry etching techniques include physical dry etching (using ion, photon or electron beams), chemical dry etching (using tetrafluoromethane ($CN_4$), sulfur hexafluoride ($SF_6$), nitrogen trifluoride ($NF_3$), chlorine gas ($Cl_2$), or fluorine ($F_2$)), or reactive ion etching (RIE).

The method 300 may comprise a step of thermally oxidizing the etched second substrate 332 to improve the structural rigidity of the second substrate 332, as illustrated by thermal oxide layers 334 in FIG. 3B, such that both top and bottom etched surfaces of the second substrate 332 comprise a thermal oxide layer. The thermal oxide layer 334 is illustrated as a double lined profile on surfaces of the second substrate 332. The thermal oxide layer 334 may be used to form a direct bond with the first substrate 330, as discussed below. All references to a thermal oxide layer herein may be illustrated as thermal oxide layer 334 in FIG. 3B.

At block 310, with reference to FIG. 3B, the method 300 includes patterning the first substrate 330 (e.g., a monocrystalline silicon wafer) to form patterned regions comprising a thermal oxide layer. For example, the first substrate 330 may be a single side polished wafer where one side comprises a thermal oxide layer. The thermal oxide layer may be patterned using a third photoresist layer 302A to create the patterned regions comprising a thermal oxide layer 334 (e.g., bonding thermal oxide), as illustrated in FIG. 3B. Regions between the patterned regions (e.g., adjacent regions) comprise a native oxide layer, as illustrated by the dashed line in expanded view 338 in FIG. 3B. All references to a native oxide layer herein may be illustrated as native oxide layer in expanded view 338.

The first substrate 330 may include a bulk material, and a plurality of material layers disposed on the bulk material.

The bulk material may include any semiconductor material suitable for manufacturing semiconductor devices, such as silicon, silicon germanium, germanium, group III-V semiconductor materials, group II-VI semiconductor materials, or combinations thereof. For example, in some embodiments, the first substrate 330 may include a monocrystalline wafer, such as a silicon wafer, a plurality of device components formed in or on the silicon wafer, and a plurality of interconnect layers formed over the plurality of device components. In other embodiments, the substrate may comprise a reconstituted substrate, e.g., a substrate formed from a plurality of singulated devices embedded in a support material.

The bulk material of the first substrate 330 may be thinned after the devices are formed using one or more background, etching, and polishing operations that remove material from the backside. Thinning the first substrate 330 may include using a combination of grinding and etching processes to reduce the thickness (in the Z-direction) to about 450 um or less, such as about 201 um or less, or about 150 um or less. After thinning, the backside may be polished to a desired smoothness using a chemical mechanical polishing (CMP) process, and the dielectric material layer may be deposited thereon. In some embodiments, the dielectric material layer may be polished to a desired smoothness to prepare the third substrate for the bonding process.

In some embodiments, an active side is temporarily bonded to a carrier substrate (not shown) before or after the thinning process. When used, the carrier substrate provides support for the thinning operation and/or for the thinned material to facilitate substrate handling during one or more of the subsequent manufacturing operations described herein.

At block 320, the method 300 includes directly bonding the patterned regions of the first substrate 330 to the second substrate 332 to form a bonding interface, wherein the bonded first and second substrates form the integrated cooling assembly 203.

Figure 4:
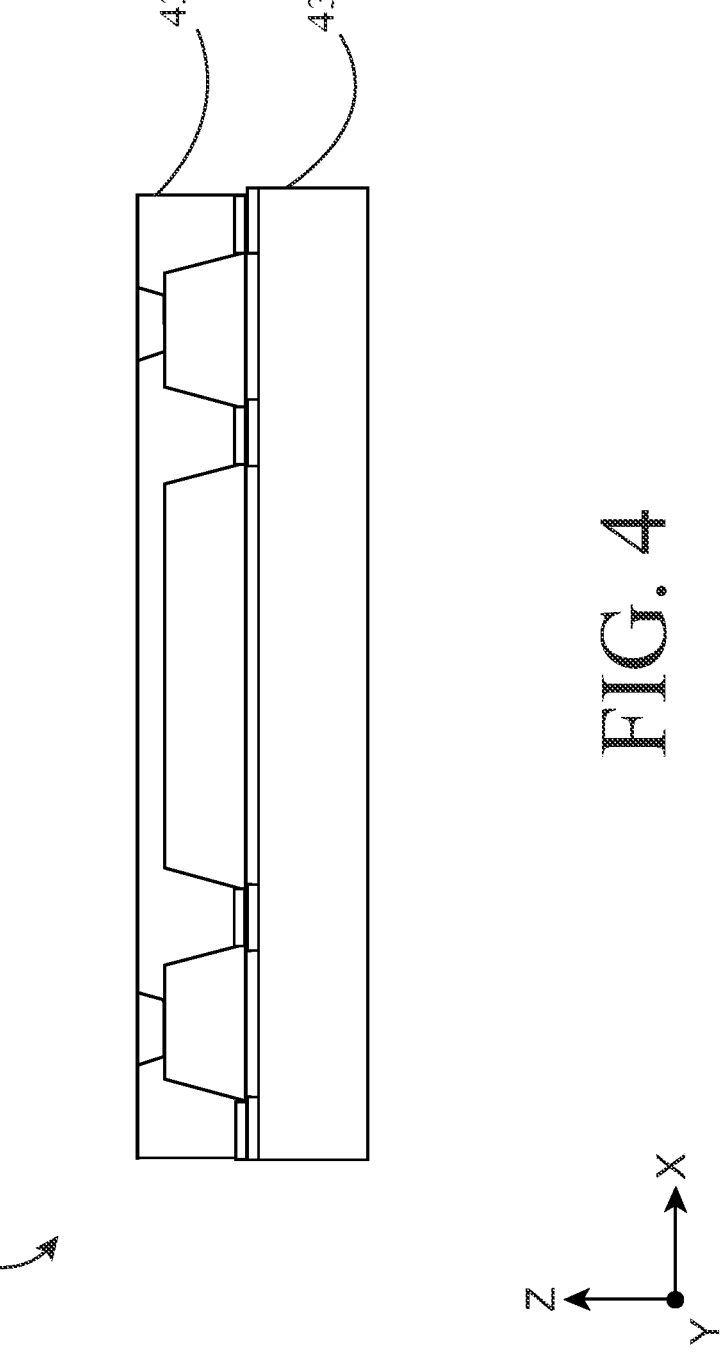
FIG. 4 is a schematic sectional view of another integrated cooling assembly of the device package, according to some embodiments.

In certain embodiments, before the first and second substrates are bonded together, the method of patterning the first substrate 330 to form patterned regions, described above in block 310, may also be applied to the second substrate 332 to form patterned regions comprising a thermal oxide layer (e.g., bonding thermal oxide) on the second substrate 332 with native oxide layers therebetween. FIG. 4 is a schematic sectional view of another example integrated cooling assembly 403 in which a first substrate 430 and a second substrate 432 both comprise patterned regions, as discussed above.

As illustrated in FIG. 4, the patterned regions of the first substrate 430 may be bonded to the patterned regions of the second substrate 432 to form the bonding interface, and portions of the first substrate 430 and portions of the second substrate 432 exposed to a coolant chamber volume therebetween comprise a native oxide layer. Here, the patterning is such that portions of both the first and second substrates between the bonding interface comprise a native oxide layer exposed to a coolant chamber volume 210. As illustrated in FIG. 4, all surfaces of the first and second substrates which face the coolant chamber volume 210 comprise a native oxide layer in place of a thermal oxide layer. In particular, the sidewalls, a bottom side of the second substrate 432 facing the first substrate 430, and portions of the top surface of the first substrate 430 between the patterned regions and facing the second substrate 432 all comprise a native oxide layer in place of a thermal oxide layer. In embodiments where the second substrate 432 comprises an inlet opening and an outlet opening, the native oxide layer extends between the openings, as shown.

Advantageously, by providing a native oxide layer on portions of both first and second substrates exposed to a coolant chamber volume, the proportion of a cold plate having a native oxide layer which is directly exposed to coolant fluid is increased. Therefore, heat generated by an attached semiconductor device is more efficiently transferred to coolant fluid flowing through the coolant chamber volume.

Figure 5:
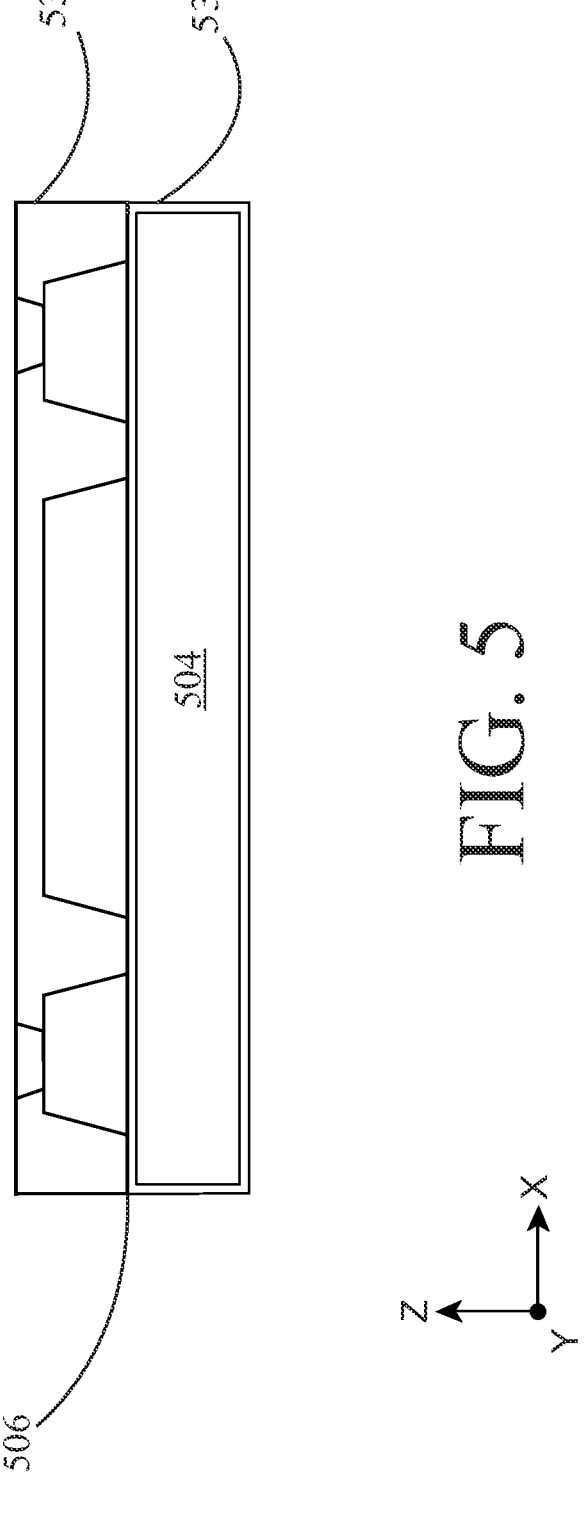
FIG. 5 is a schematic sectional view of another integrated cooling assembly of the device package, according to some embodiments.
Figure 6:
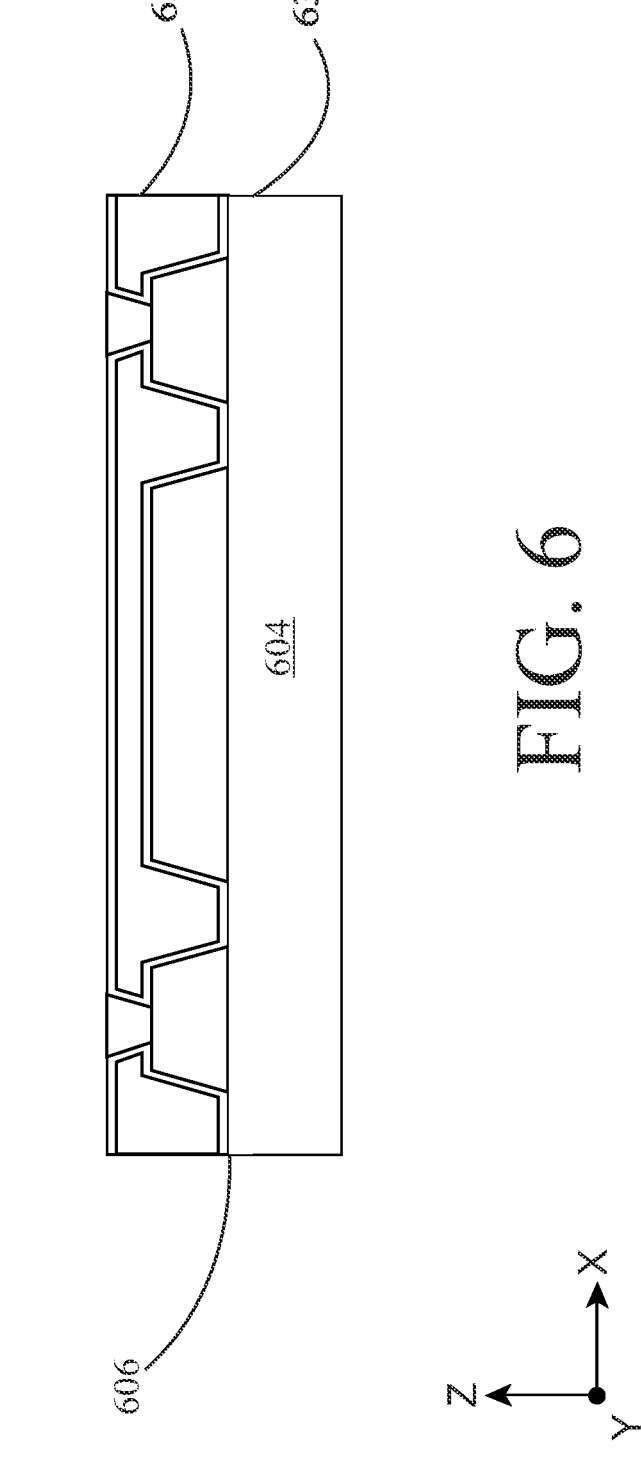
FIG. 6 is a schematic sectional view of another integrated cooling assembly of the device package, in accordance with embodiments of the present disclosure.

In some embodiments, the first substrate 330 may be patterned such that all surfaces of the first substrate 330 are patterned regions comprising a thermal oxide layer. The second substrate 332 may be devoid of a thermal oxide layer such that all surfaces of the second substrate 332 comprise a native oxide layer. Examples of such embodiments are illustrated in FIG. 5 and FIG. 6. FIG. 5 is a schematic sectional view of another example integrated cooling assembly 503, in which a first substrate 530 comprises a semiconductor device 504 and a second substrate 532 comprises a cold plate 506. FIG. 6 is a schematic sectional view of another example integrated cooling assembly 603, in which a first substrate 630 comprises a cold plate 606 and a second substrate 632 comprises a semiconductor device 604. In the embodiments illustrated in FIG. 5 and FIG. 6, only the first substrate 530, 630 comprises a thermal oxide layer for forming the bonding interface between the first and second substrates. The thermal oxide layer may be continuous across all surfaces of the first substrate 530, 630, and all surfaces of the second substrate 532, 632 may comprise a native oxide layer.

The advantages associated with exposing surface of a cold plate comprising a native oxide layer directly to coolant fluid, as discussed above, apply equally to embodiments illustrated by FIG. 5 and FIG. 6.

The bonding interface may be taken to be any interface at which the first and second substrates are directly bonded together. For example, with reference to FIG. 3B and FIG. 2B, a top side of the first substrate 330 (e.g., the backside 220 of the semiconductor device 204) faces towards the second substrate 332 and patterned regions comprising thermal oxide are disposed along the perimeter of the top side and opposite the support features 224. A bottom side of the sidewalls 213 facing the top side of the first substrate 330 may also comprises a thermal oxide layer. Therefore, the thermal oxide layer on the bottom side of the sidewalls 213 directly bonds with the thermal oxide layer on the top side of the first substrate 330 to form the bonding interface. The bonding interface follows at least the perimeter of the first substrate 330 such that a continuous bond is formed between the first substrate 330 and the second substrate 332. In embodiments where the perimeter of the cold plate 206 is rectangular, the bonding interface around the perimeter is rectangular. As discussed in more detail below, the bonding interface may be formed by a single thermal oxide layer, for example using only the thermal oxide layer on the bottom side of the sidewalls 213, or only the thermal oxide layer on the top side of the first substrate 330.

In FIG. 2B, the portion of the cold plate 206 comprising the native oxide layer exposed to the coolant chamber volume 210 is a portion of the first substrate 330. That is, the portion of the top side of the of the first substrate 330 disposed between the bonding interface comprises the exposed native oxide layer. As illustrated, the bonding interface is formed at regions where the sidewalls 213 meet the first substrate 330 and at regions where the support features 224 meet the first substrate 330. Therefore, the native oxide layer is disposed on the top surface of the first substrate 330 between the bonding interface regions. Portions of the native oxide layer between the sidewalls 213 and the support features 224 are directly exposed to the coolant chamber volume 210, in FIG. 2B. Here, the terminology "between the bonding interface" is taken to mean a region adjacent to a bonding interface region.

Here, the method 300 may include forming dielectric layers on the first substrate 330 and the second substrate 332, and directly bonding may include forming dielectric bonds between a first dielectric material layer of the first substrate 330 and a second dielectric material layer of the second substrate 332. The dielectric layers may be formed at least on the patterned regions of the first and/or second substrate(s).

Generally, directly bonding the surfaces (of the dielectric material layers) includes preparing, aligning, and contacting the surfaces. Preparing the surfaces may include smoothing the respective surfaces to a desired surface roughness, such as between 0.1 to 3.0 nm RMS, activating the surfaces to weaken or open chemical bonds in the dielectric material, and terminating the surfaces with a desired species. Smoothing the surfaces may include polishing the substrates using a chemical mechanical polishing (CMP) process. Activating and terminating the surfaces with a desired species may include exposing the surfaces to radical species formed in a plasma (e.g., a plasma activation process).

In some embodiments, the plasma is formed using a nitrogen-containing gas, e.g., $N_2$, and the terminating species includes nitrogen and hydrogen. In some embodiments, the surfaces may be activated using a wet cleaning process, e.g., by exposing the surfaces to an aqueous ammonia solution. In some embodiments, the dielectric bonds may be formed using a dielectric material layer deposited on only one of the substrates but not on both. In those embodiments, the direct dielectric bonds may be formed by contacting the deposited dielectric material layer of one substrate directly with a bulk material surface of the other substrate.

Directly forming direct dielectric bonds between the substrates includes bringing the prepared and aligned surfaces into direct contact at a temperature less than 150° C., such as less than 100° C., for example, less than 30° C., or about room temperature, e.g., between 20° C. and 30° C. Without intending to be bound by theory, it is believed that the hydrogen terminating species diffuse from the interfacial bonding surfaces, and chemical bonds are formed between the remaining nitrogen species during the direct bonding process. In some embodiments, the direct bond is strengthened using an anneal process, where the substrates are heated to and maintained at a temperature of greater than about 30° C. and less than about 450° C., for example, greater than about 50° C. and less than about 250° C., or about 150° C. for a duration of about 5 minutes or more, such as about 15 minutes. Typically, the bonds will strengthen over time even without the application of heat. Thus in some embodiments, the method does not include heating the substrates.

After the dielectric bonds are formed, the substrates may be heated to a temperature of 150° C. or more and maintained at the elevated temperature for a duration of about 1 hour or more, such as between 8 and 24 hours, to form direct metallurgical bonds between the metal features. Suitable direct dielectric and hybrid bonding technologies that may be used to perform aspects of the methods described herein include ZiBond® and DBI®, each of which are commercially available from Adeia Holding Corp., San Jose, CA, USA.

The method 300 may include singulating an integrated cooling assembly comprising the cold plate 206 and the semiconductor device 204 from the bonded first and second substrates.

It will be understood that first substrate 330 may be a semiconductor device die or part of a wafer of semiconductor devices. Further, the second substrate 332 may be a cold plate die or part of a wafer of cold plates. Therefore, block 320 may include direct die-to-die bonding (e.g., cold plate die to semiconductor device die), direct wafer-to-die bonding (e.g., cold plate die to semiconductor device wafer, or cold plate wafer to semiconductor device die), and wafer-to-wafer bonding (e.g., cold plate wafer to semiconductor device wafer).

Singulation after bonding imparts distinctive structural characteristics on integrated cooling assemblies as the bonding surface of cold plates have the same perimeter as the backside of the semiconductor devices bonded thereto. Thus, the sidewalls of the cold plate 206 is typically flush with the edges of the semiconductor device 204 about their common perimeters. In some embodiments, the cold plate 206 is singulated from the first and second substrates using a process that cuts or divides the first and second substrate in a vertical plane (i.e., parallel to the Z-direction). In those embodiments, the sides of the cold plate 206 are substantially perpendicular to the backside of the semiconductor device 204 (i.e., a horizontal (X-Y) plane of an attachment interface between the semiconductor device 204 and the cold plate 206). In some embodiments, the cold plate 206 is singulated using a saw or laser dicing process.

The method 300 may include sealingly attaching a package cover (for example, as illustrated in FIG. 2B) to the integrated cooling assembly 203 by use of a material layer disposed therebetween, where the package cover comprising an inlet opening and an outlet opening. The method may further comprise, before or after attaching the package cover to the integrated cooling assembly 203, forming openings in the material layer to fluidly connect the inlet opening and the outlet opening to the cold plate 206.

It is contemplated that the methods above are not limited to crystalline silicon as sloped surfaces can be formed using other methods known to those skilled in the art. Thus, in some embodiments, the cold plates may be formed of a bulk material having a substantially similar coefficient of linear thermal expansion (CTE) to the bulk material of the device, where the CTE is a fractional change in length of the material (in the X-Y plane) per degree of temperature change. In some embodiments, the CTEs of the first and second substrates are matched so that the CTE of the second substrate is within about +/−20% or less of the CTE of the first substrate, such as within +/−15% or less, within +/−10% or less, or within about +/−5% or less when measured across a desired temperature range. In some embodiments, the CTEs are matched across a temperature range from about −60° C. to about 100° C. or from about 60° C. to about 175° C. In one example embodiment, the matched CTE materials each include silicon.

As a result of the patterning step described in block 310, patterned regions of the cold plate 206 exposed to the coolant chamber volume 210 are devoid of thermal oxide. In place of a thermal oxide layer, the exposed patterned regions comprise a native oxide layer.

It will be understood that a native oxide layer may have a thickness in the range of 2 nm to 5 nm. Whereas, a thermal oxide layer may have a thickness greater than 5 nm, for example in the range of 10 nm to 100 nm. The native oxide layer disposed between the bonding interface (and exposed to the coolant chamber volume 210) is therefore thinner than a thermal oxide layer (which has been removed). Hence, the thermal oxide layer facilitates more efficient thermal transfer from the semiconductor device, to the cold plate 206, and into coolant fluid flowing through the coolant chamber volume 210 of the cold plate 206.

Here, oxide layer "thickness" is a depth of an oxide layer measured orthogonally to a corresponding substrate surfaces on which the oxide layer is disposed.

Advantageously, substrate surfaces comprising a native oxide layer (of about 2 nm to 5 nm thickness) provide around an 8% to 10% improvement in thermal transfer compared to substrate surfaces comprising only a thermal oxide layer. Therefore, by providing a native oxide layer on patterned regions of a cold plate exposed to a coolant chamber volumes, the efficiency at which heat is transferred from the semiconductor device to coolant fluid via the cold plate substrate(s) is improves by around 8% to 10%.

Figure 7:
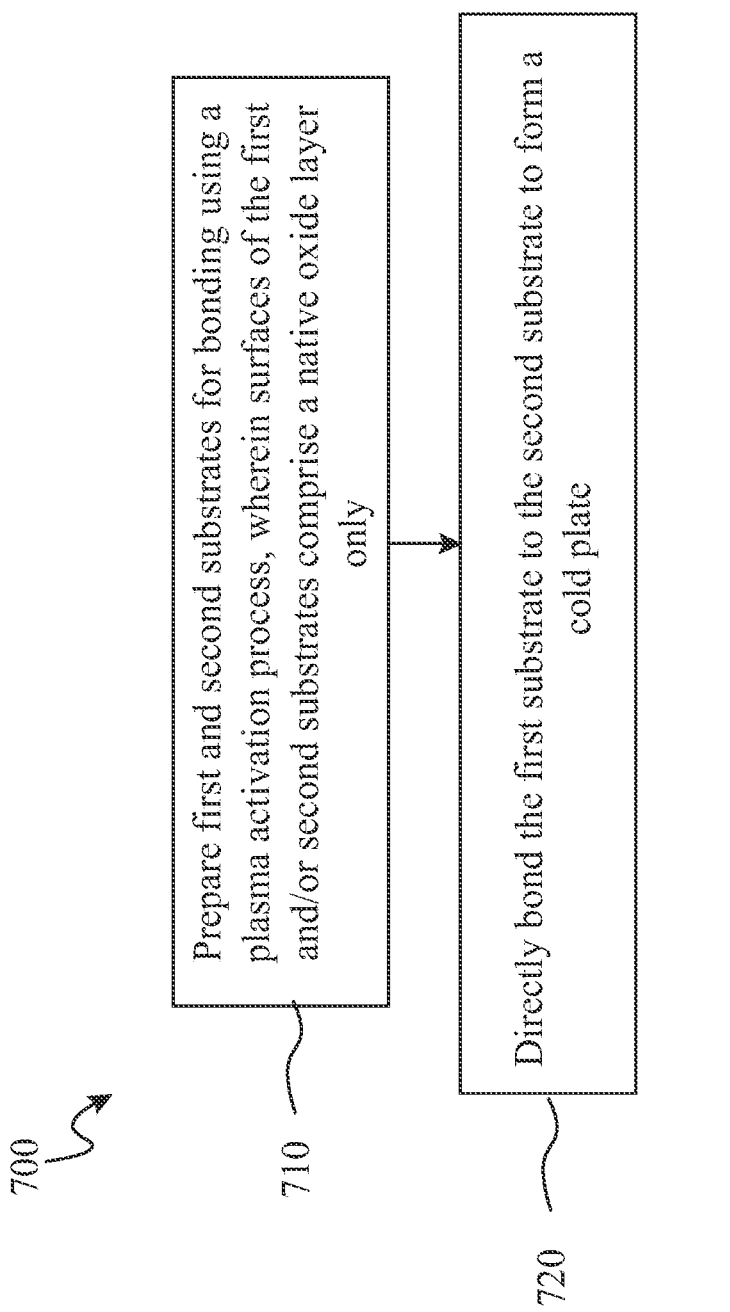
FIG. 7 shows a method that can be used to manufacture the integrated cooling assemblies described herein.
Figure 8:
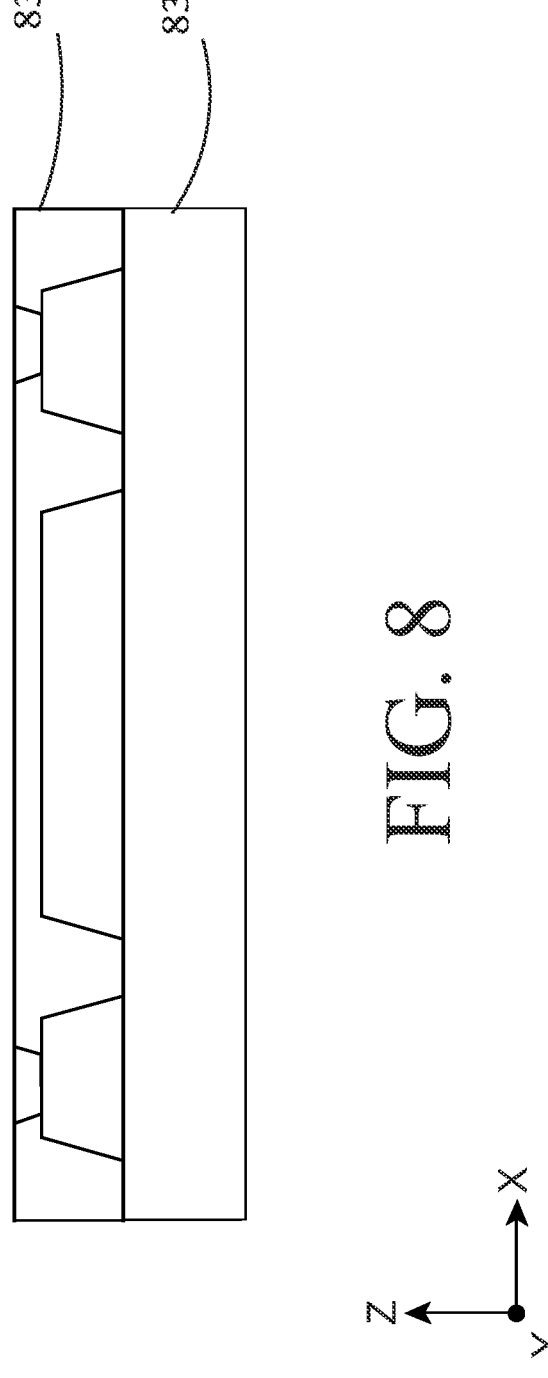
FIG. 8 is a schematic sectional view of another integrated cooling assembly of the device package, according to some embodiments.

FIG. 7 is a flow diagram setting forth a method 700 of forming an integrated cooling assembly, according to embodiments of the disclosure. FIG. 8 a schematic sectional view of an example integrated cooling assembly 803 manufactured according to the method 700.

At block 710, with reference to the integrated cooling assembly 803 of FIG. 8, the method 700 includes preparing first and second substrates for bonding using a plasma activation process, wherein surfaces of the first and/or second substrate(s) comprise a native oxide layer only. That is, an entire surface of the first substrate 830 may be patterned to comprise a continuous native oxide layer in place of a thermal oxide layer. Such patterning may be produced using any of the patterning method step discussed above in relation to the method 300, for example the method step of block 310. Additionally or alternatively, an entire surface of the second substrate 832 may comprise a continuous native oxide layer in place of a thermal oxide layer. In embodiments illustrated by FIG. 8, all surfaces of the first and second substrates comprise a continuous native oxide layer in place of a thermal oxide layer. The plasma activation process used to prepare the first and second substrates may be the same plasma activation process as described above in relation to method 300.

At block 720, with reference to the integrated cooling assembly 803 of FIG. 8, the method 700 includes directly bonding the first substrate 830 to the second substrate 832 to form the integrated cooling assembly 803. The first substrate 830 may be directly bonded to the second substrate 832 using the same direct bonding method as described above.

Embodiments in which integrated cooling assemblies are provide with coolant chamber volumes having an increased surface area will now be discussed with reference to FIG. 9 to FIG. 11. In the following description, integrated cooling assembly surfaces all comprise a thermal oxide layer. However, it will be understood that any of the above methods may be used to manufacture the following integrated cooling assemblies in order to provide surfaces having native oxide layers exposed to a coolant chamber volume.

Figure 9:
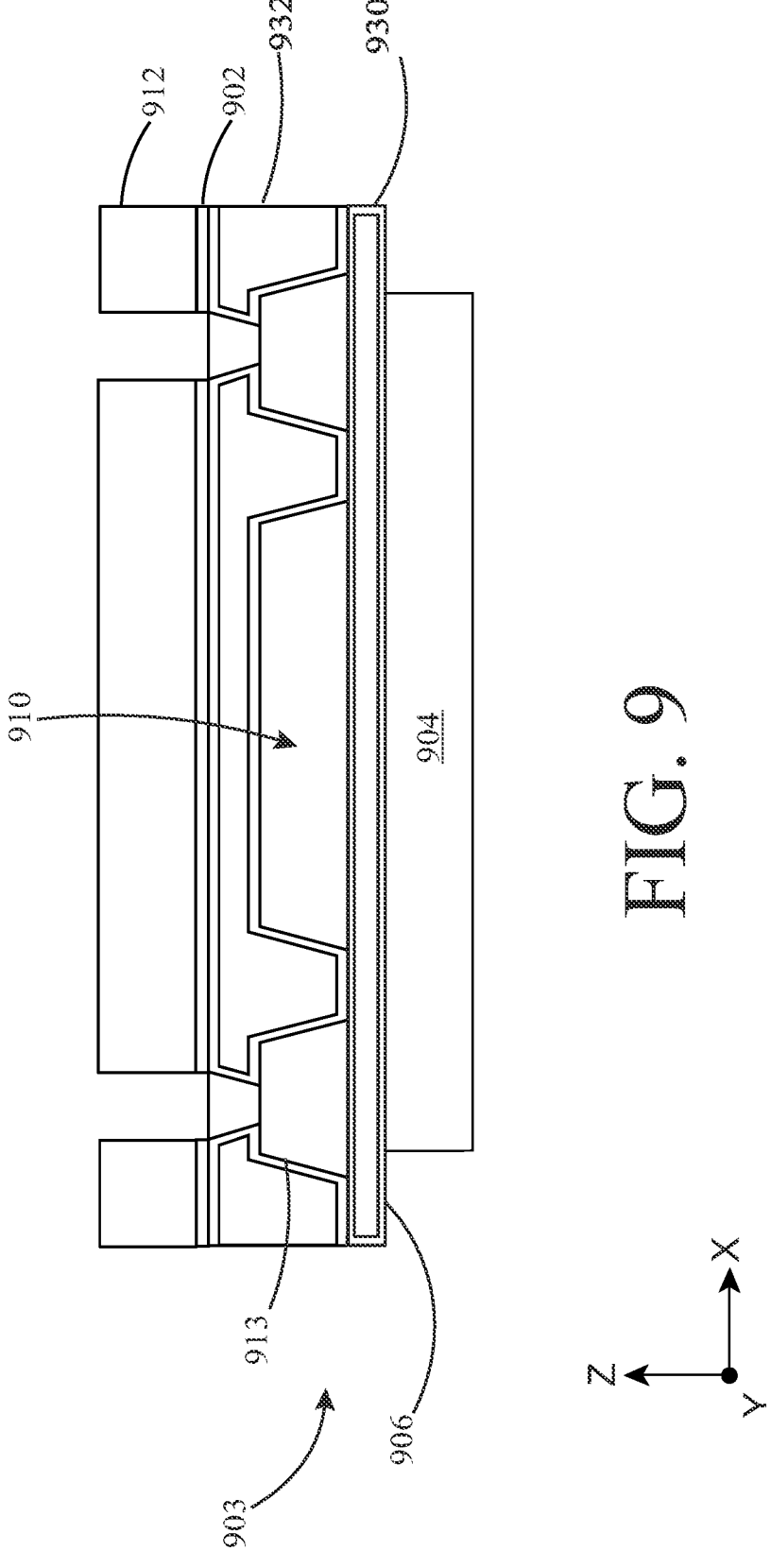
FIG. 9 is a schematic sectional view of another integrated cooling assembly of the device package, according to some embodiments.

FIG. 9 is a schematic sectional view of an example integrated cooling assembly 903, in accordance with embodiments of the present disclosure. The integrated cooling assembly 903 of FIG. 9 comprises a semiconductor device 904 attached to a cold plate 906.

The cold plate 906 comprises a top portion 932 and a bottom portion 930. Here, the top portion 932 and the bottom portion 930 are stacked vertically such that the bottom portion 930 is positioned between the top portion 932 and the semiconductor device 904. In FIG. 9, the top portion 932 comprises sidewalls 913 extending downwardly to the bottom portion 930 to define a coolant chamber volume 910 therebetween. That is, the coolant chamber volume 910 is defined as a volume between the top portion 932 and the bottom portion 930 through which coolant (e.g., fluid) may flow.

As illustrated in FIG. 2, the bottom portion 930 is bonded to a backside of the semiconductor device 904. In some embodiments, the bottom portion 930 is bonded to the backside of the semiconductor device 904 without the use of an intervening adhesive material. Thus, the bottom portion 930 may be directly bonded to the backside of the semiconductor device 904 such that the cold plate 906 and the semiconductor device 904 are in direct contact.

The sidewalls 913 and the bottom portion 930 may be bonded to form a bonded interface therebetween. The bonded interface may alternatively be referred to as a bonding interface for consistency with the methods discussed above. The bonded interface may be formed using at least one thermal oxide layer disposed on the top portion 932 and/or the bottom portion 930.

Figure 10:
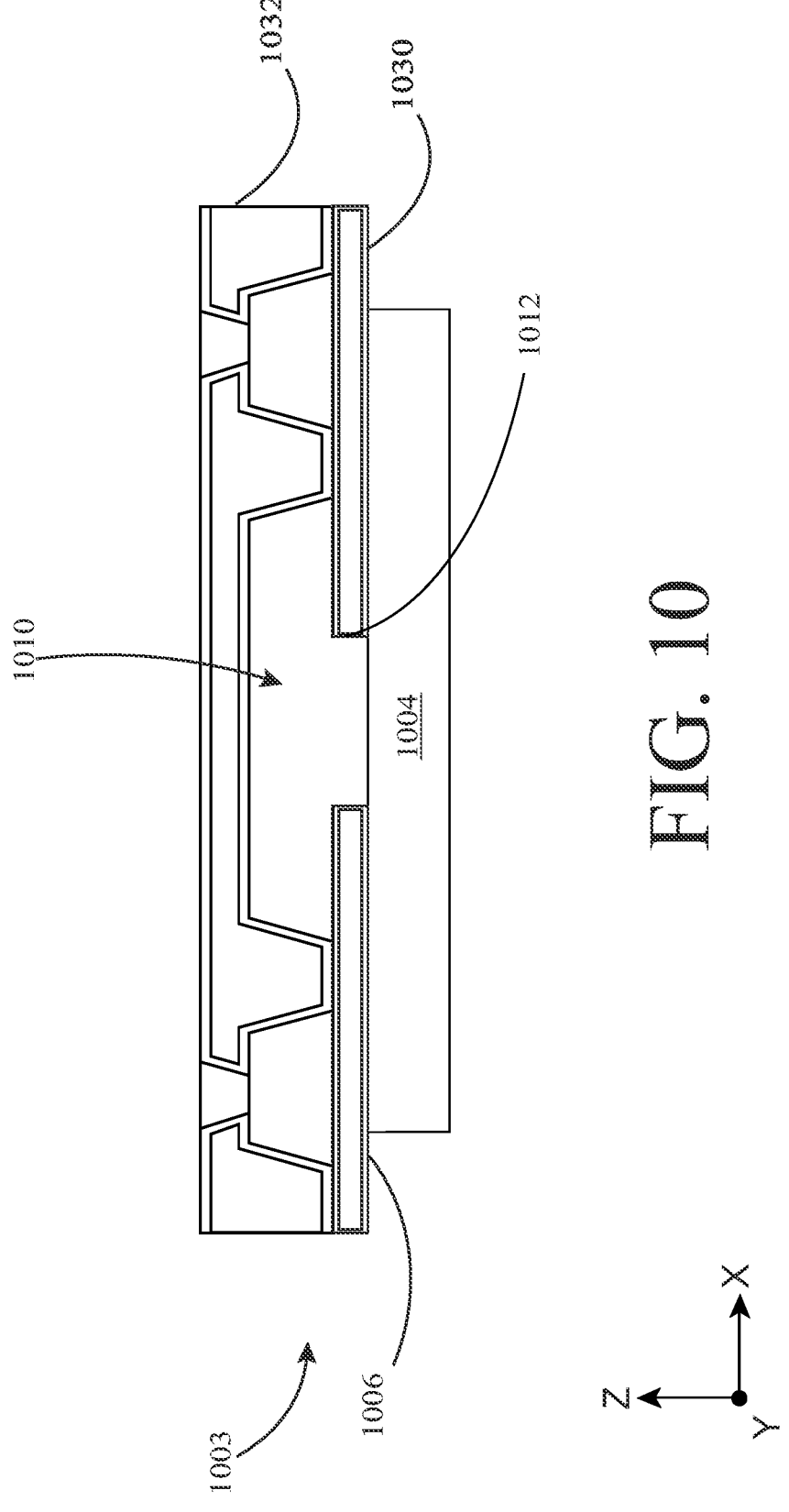
FIG. 10 is a schematic sectional view of another integrated cooling assembly of the device package, according to some embodiments.
Figure 11:
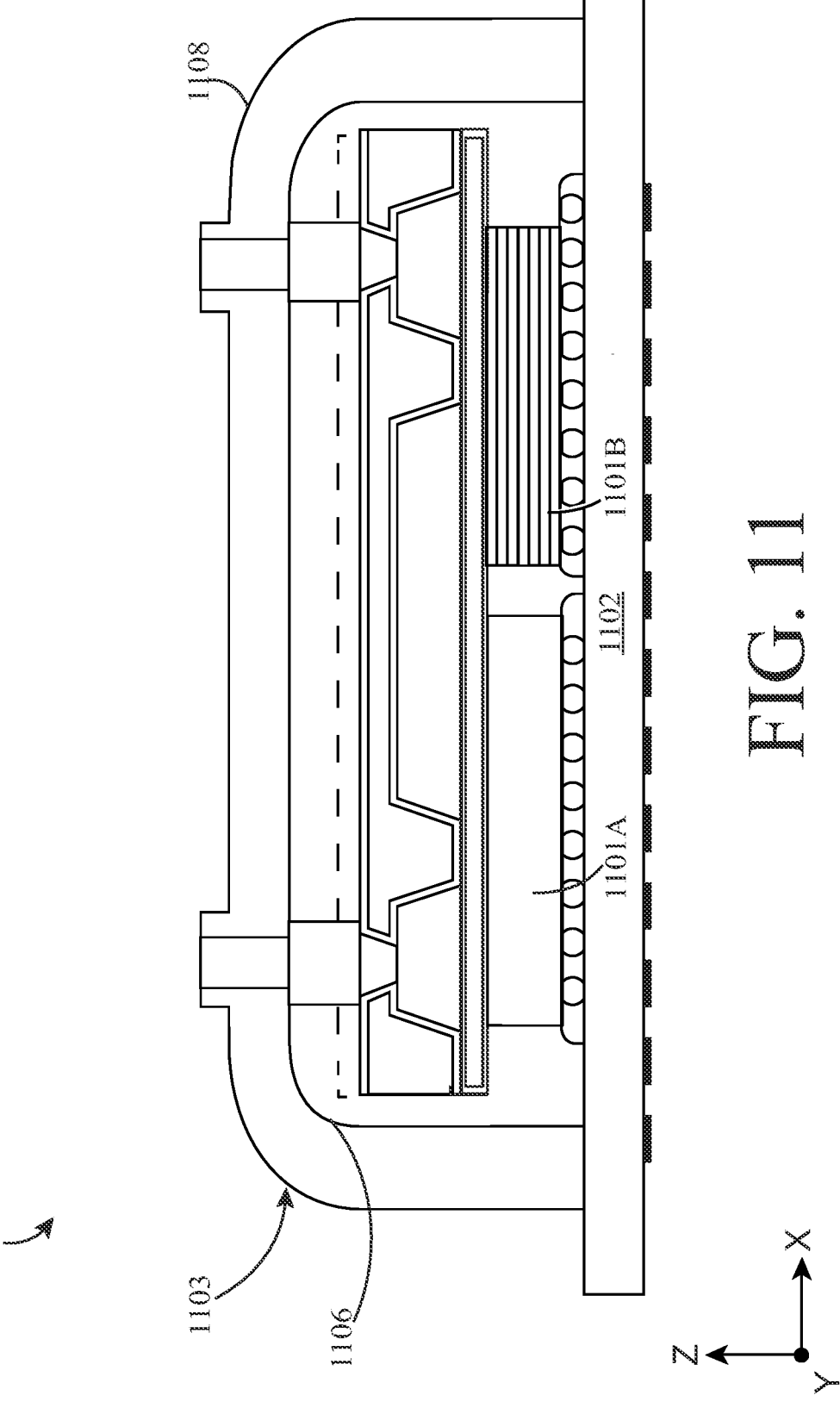
FIG. 11 is a schematic sectional view of another example device package, in accordance with embodiments of the present disclosure, that may be used with the system panel.

In FIG. 9, FIG. 10 and FIG. 11, all surfaces of the top and bottom portions comprise a thermal oxide layer. However, it will be understood that patterning and bonding of the top and bottom portions in these figures may use any of the methods discussed above in relation to patterning and bonding the first and second substrates in order to form native oxide layers. Therefore, further description of patterning and bonding the top and bottom portions 932, 930 will be omitted here for brevity.

In some embodiments, the cold plate 906 is attached to the semiconductor device 904 using a direct dielectric bonding process. In other embodiments, the cold plate 906 is attached to the semiconductor device 904 using a hybrid of direct dielectric bonds and direct metal bonds formed therebetween, as discussed above.

A width of the coolant chamber volume 910 may be defined as a distance between the sidewalls 913. In some embodiments, the cold plate 906 is rectangular and the sidewalls 913 comprises two pairs of opposite sidewalls which are orthogonal to each other. The two pairs of opposite sidewalls define the perimeter of the coolant chamber volume 910. In such embodiments, the width of the coolant chamber volume 910 may be defined as the distance between either pair of opposite sidewalls (e.g., in the X-axis direction or the Y-axis direction). The width of the coolant chamber volume 910 may be taken substantially parallel to the backside of the semiconductor device 904. The length of the coolant chamber volume 910 may be defined as the distance between the other pair of opposite sidewalls (e.g., in the Y-axis direction or the X-axis direction).

In embodiments where the semiconductor device 904 is rectangular, the semiconductor device 904 comprises two pairs of opposite edges which are orthogonal to each other. The two pairs of opposite edges define a perimeter of the semiconductor device 904. In such embodiments, a width of the semiconductor device 904 may be defined as the distance between either pair of opposite edges of the semiconductor device 904 (e.g., in the X-axis direction or the Y-axis direction). The length of the semiconductor device 904 may be defined as the distance between the other pair of opposite edges of the semiconductor device 904 (e.g., in the Y-axis direction or the X-axis direction).

Here, the width of the coolant chamber volume 910 between opposite sidewalls of the top portion 932 is greater than the width of the backside of the semiconductor device 904 (in the same direction). That is, the coolant chamber volume 910 has a width in at least one direction that is greater than the width of the semiconductor device 904 in the same direction, such that a portion of the coolant chamber volume 910 extends past at least one edge of the semiconductor device 904. In other words, the cold plate 906 extends laterally beyond at least one edge of the semiconductor device 904 in the X-axis direction or the Y-axis direction in order to increase the volume of the coolant chamber volume 910. In the embodiments shown in FIG. 9, the coolant chamber volume 910 extends past both opposite edges of the semiconductor device 904 in the X-axis direction. In embodiments where the width and the length of the coolant chamber volume 910 are both greater than the width and length of the semiconductor device 904, the coolant chamber volume 910 extends past at least one of the opposite edges of the semiconductor device 904 in the X-axis direction and extends past at least one opposite edge of the semiconductor device 904 in the Y-axis direction.

Advantageously, by increasing the width of the coolant chamber volume 910 to be greater than the width of a semiconductor device 904 to which it is attached, the coolant chamber volume 910 is able to absorb heat from the semiconductor device 904 at a greater rate, which improves the rate of cooling. Further, such coolant chamber volumes may hold a greater quantity of coolant fluid, which further improves the rate of cooling.

A footprint of the coolant chamber volume 910 may be defined by the sidewalls 213. For example, where the cold plate 906 is rectangular, the footprint of the coolant chamber volume 910 is defined as the surface area between the two pairs of opposite sidewalls 213. Similarly, a footprint of the backside of the semiconductor device 904 may be defined as the surface area between the two pairs of opposite edges of the semiconductor device 904. Therefore, where the width and length of the coolant chamber volume 910 are both greater than the width and length of the semiconductor device 904, the footprint of the coolant chamber volume 910 is greater than the footprint of the backside of the semiconductor device 904.

Increasing the length as well as the width of the coolant chamber volume 910 further improves cooling efficiency.

Optionally, the integrated cooling assembly 903 may comprise a heat sink 912 attached to the cold plate 906. The heat sink 912 may be a metal heat sink comprising any metal with a relatively high thermal conductivity. For example, the heat sink 912 may comprise copper (with a thermal conductivity of around 401 $Wm^{-1}K^{-1}$) or aluminum (with a thermal conductivity of around 237 $Wm^{-1}K^{-1}$).

The heat sink 912 may comprise an inlet opening and an outlet opening which are in fluid communication with the inlet and outlet openings of the cold plate 906 and the inlet and outlet openings of a corresponding package cover. Therefore, the inlet and outlet openings of the heat sink 912 may also be in fluid communication with a coolant chamber volume of the cold plate 906.

Here, the heat sink 912 is attached to the cold plate 906 with a compliant layer 902. That is, a compliant adhesive layer is provided between a top portion of the cold plate 906 and a surface of the heat sink to attach the heat sink 912 to the top portion.

As shown, the heat sink 912 may extend laterally beyond at least two opposite sidewalls 213 to increase the volume of the heat sink 912, which maximizes the effectiveness of thermal transfer provided by the heat sink 912. In some embodiments, the heat sink may extend laterally beyond all four sidewalls 213 to further increase the volume of the heat sink 912. That is, a width of the heat sink 912 is greater than a width of the cold plate 906 in the X-axis direction and/or in the Y-axis direction.

FIG. 10 is a schematic sectional view of another example integrated cooling assembly 1003, in accordance with embodiments of the present disclosure. The integrated cooling assembly 1003 of FIG. 10 comprises a cold plate 1006 and a semiconductor device 1004. Here, the cold plate 1006 comprises a top portion 1032 and a bottom portion 1030. The bottom portion 1030 comprises a sidewall 1012 defining an opening in the bottom portion 1030 to expose a portion of the backside of the semiconductor device 1004 to a coolant chamber volume 1010 of the cold plate 1006.

The opening in the bottom portion 1030 provides for coolant fluid flowing through the coolant chamber volume 1010 to directly contact the backside of the semiconductor device 1004. By providing direct contact between the backside and coolant fluid, the efficiency of thermal transfer of heat from the semiconductor device 1004 to the coolant fluid is improved.

The opening in the bottom portion 1030 may be a proportion of the overall width of the coolant chamber volume 1010 defined between sidewalls the top portion 1032 extending downwardly from the top portion 1032 to the bottom portion 1030. For example, the sidewall 1012 may define an opening having a width which is 2%, 5%, 10% or 20% of the width of the coolant chamber volume 1010.

FIG. 11 is a schematic side sectional view of an example of a multi-component device package 1101 that includes a cold plate 1106 directly bonded to the backside surfaces of two or more devices 1101A, 1101B. As shown, the device package 1101 includes a package substrate 1102, an integrated cooling assembly 1103 and a package cover 1108. The integrated cooling assembly 1103 may include a plurality of devices 1101A (one shown) which may be singulated and/or disposed in a vertical device stack 1101B (one shown). The cold plate 1106 may be attached to each of the devices 1101A and device stack 1101B, e.g., by the direct bonding methods described herein or other method including flip chip bonding, etc. In some embodiments, the device 1101A may comprise a processor and the device stack 1101B may comprise a plurality of memory devices. Here, the device 1101A and the device stack 1101B are disposed in a side-by-side arrangement on the package substrate 1102 and are in electrical communication with one another through conductive elements formed in, on, or through the package substrate 1102. Here, the cold plate 1106 is sized to provide a bonding surface for attachment to both the device 1101A and the device stack 1101B but may otherwise be the same or substantially similar to other cold plates described herein.

The methods and device packages described above advantageously provides for integrated cooling assemblies with increased convective heat transfer from a semiconductor device to a coolant fluid, which facilitates an increase in power density of advanced device packages.

The embodiments discussed above are intended to be illustrative and not limiting. One skilled in the art would appreciate that individual aspects of the cooling assemblies, device packages, and methods discussed herein may be omitted, modified, combined, and/or rearranged without departing from the scope of the disclosure. Only the claims that follow are meant to set bounds as to what the present disclosure includes.

What is claimed is:

1. A device package comprising:

an integrated cooling assembly comprising a semiconductor device and a cold plate attached to the semiconductor device, wherein:

the cold plate comprises a top portion and a bottom portion;

the bottom portion is bonded to a backside of the semiconductor device;

the top portion comprises sidewalls extending downwardly to the bottom portion to define a coolant chamber volume therebetween;

a width of the coolant chamber volume between opposite sidewalls of the top portion is greater than a width of the backside of the semiconductor device; and a sidewall defining an opening in the bottom portion exposes a portion of the backside of the semiconductor device to the coolant chamber volume.

2. The device package of claim 1, wherein the cold plate is attached to the semiconductor device using direct bonding.

3. The device package of claim 1, wherein a footprint of the coolant chamber volume defined by sidewalls of the top portion is greater than a footprint of the backside of the semiconductor device.

4. A device package comprising:

an integrated cooling assembly comprising a semiconductor device and a cold plate attached to the semiconductor device, wherein:

the cold plate comprises a top portion and a bottom portion;

the bottom portion is bonded to a backside of the semiconductor device;

the top portion comprises sidewalls extending downwardly to the bottom portion to define a coolant chamber volume therebetween;

a width of the coolant chamber volume between opposite sidewalls of the top portion is greater than a width of the backside of the semiconductor device; and the bottom portion is bonded to the sidewalls at a bonded interface.

5. A device package comprising:

an integrated cooling assembly comprising a semiconductor device and a cold plate attached to the semiconductor device, wherein:

the cold plate comprises a top portion and a bottom portion;

the bottom portion is bonded to a backside of the semiconductor device;

the bottom portion comprises a thermal oxide layer;

the top portion comprises sidewalls extending downwardly to the bottom portion to define a coolant chamber volume therebetween;

a width of the coolant chamber volume between opposite sidewalls of the top portion is greater than a width of the backside of the semiconductor device; and the sidewalls are bonded to the thermal oxide layer to form a bonded interface.

6. A device package comprising:

an integrated cooling assembly comprising a semiconductor device and a cold plate attached to the semiconductor device, wherein:

the cold plate comprises a top portion and a bottom portion;

the bottom portion is bonded to a backside of the semiconductor device;

the top portion comprises sidewalls extending downwardly to the bottom portion to define a coolant chamber volume therebetween;

a width of the coolant chamber volume between opposite sidewalls of the top portion is greater than a width of the backside of the semiconductor device;

the sidewalls comprise a thermal oxide layer; and the bottom portion is bonded to the sidewalls to form a bonded interface.

7. A device package comprising:

an integrated cooling assembly comprising a semiconductor device and a cold plate attached to the semiconductor device, wherein:

the cold plate comprises a top portion and a bottom portion;

the bottom portion is bonded to a backside of the semiconductor device;

the bottom portion comprises a thermal oxide layer;

the top portion comprises sidewalls extending downwardly to the bottom portion to define a coolant chamber volume therebetween;

the sidewalls comprise a thermal oxide layer;

the thermal oxide layer of the bottom portion is bonded to the thermal oxide layer of the sidewalls to form a bonded interface; and a width of the coolant chamber volume between opposite sidewalls of the top portion is greater than a width of the backside of the semiconductor device.

8. A device package comprising:

an integrated cooling assembly comprising a semiconductor device and a cold plate attached to the semiconductor device, wherein:

the cold plate comprises a top portion and a bottom portion;

the bottom portion is bonded to a backside of the semiconductor device;

the top portion comprises sidewalls extending downwardly to the bottom portion to define a coolant chamber volume therebetween;

portions of the top portion exposed to the coolant chamber volume comprise a native oxide layer; and a width of the coolant chamber volume between opposite sidewalls of the top portion is greater than a width of the backside of the semiconductor device.

9. A device package comprising:

an integrated cooling assembly comprising a semiconductor device and a cold plate attached to the semiconductor device, wherein:

the cold plate comprises a top portion and a bottom portion;

the bottom portion is bonded to a backside of the semiconductor device;

the top portion comprises sidewalls extending downwardly to the bottom portion to define a coolant chamber volume therebetween;

portions of the bottom portion exposed to the coolant chamber volume comprise a native oxide layer; and a width of the coolant chamber volume between opposite sidewalls of the top portion is greater than a width of the backside of the semiconductor device.

10. A device package comprising:

an integrated cooling assembly comprising a semiconductor device and a cold plate attached to the semiconductor device, wherein:

the cold plate comprises a top portion and a bottom portion;

the bottom portion is bonded to a backside of the semiconductor device;

the top portion comprises sidewalls extending downwardly to the bottom portion to define a coolant chamber volume therebetween;

portions of the bottom portion and portions of the top portion exposed to the coolant chamber volume both comprise a native oxide layer; and a width of the coolant chamber volume between opposite sidewalls of the top portion is greater than a width of the backside of the semiconductor device.

11. The device package of claim 8, wherein the native oxide layer is about 2-5 nm thick.

12. A device package comprising:

an integrated cooling assembly comprising a semiconductor device, a cold plate attached to the semiconductor device, and a heat sink attached to the cold plate wherein:

the cold plate comprises a top portion and a bottom portion;

the bottom portion is bonded to a backside of the semiconductor device;

the top portion comprises sidewalls extending downwardly to the bottom portion to define a coolant chamber volume therebetween;

a width of the coolant chamber volume between opposite sidewalls of the top portion is greater than a width of the backside of the semiconductor device; and the heat sink is attached to the cold plate with a compliant adhesive layer.

13. The device package of claim 1, wherein the cold plate comprises a polymer material.

14. The device package of claim 1, further comprising a package substrate, wherein:

the cold plate is disposed on the package substrate, and the semiconductor device is attached to the package substrate.

15. The device package of claim 14, wherein the device package further comprises a sealing material layer that surrounds an interface between the semiconductor device and the package substrate.

16. The device package of claim 1, wherein the cold plate further comprises:

a package cover, the package cover having an inlet opening and an outlet opening disposed therethrough, and wherein:

the coolant chamber volume is in fluid communication with the inlet opening and the outlet opening of the package cover.

17. The device package of claim 1, wherein the semiconductor device comprises two or more devices.

18. The device package of claim 2, wherein:

the top portion comprises an inlet opening;

the cold plate further comprises an outlet opening; and the coolant chamber volume is in fluid communication with the inlet opening and the outlet opening.

* * * * *